United States Patent [19]
Den et al.

[11] Patent Number: 5,155,093
[45] Date of Patent: Oct. 13, 1992

[54] LIGHT DETECTING DEVICE AND LIGHT DETECTING METHOD USING A SUPERCONNECTOR

[75] Inventors: Tohru Den, Funabashi; Katsuhiko Shinjo, Atsugi; Taiko Motoi, Atsugi; Takehiko Kawasaki, Atsugi; Norio Kaneko, Atsugi, all of Japan

[73] Assignee: Canon Kabushiki Kaisha, Tokyo, Japan

[21] Appl. No.: 548,212

[22] Filed: Jul. 5, 1990

[30] Foreign Application Priority Data

| Jul. 5, 1989 | [JP] | Japan | 1-171917 |
| Jul. 5, 1989 | [JP] | Japan | 1-171918 |
| Jul. 14, 1989 | [JP] | Japan | 1-180285 |
| Jul. 14, 1989 | [JP] | Japan | 1-180286 |
| Jul. 19, 1989 | [JP] | Japan | 1-184424 |
| Jul. 19, 1989 | [JP] | Japan | 1-184425 |
| Jul. 27, 1989 | [JP] | Japan | 1-192528 |
| Jul. 27, 1989 | [JP] | Japan | 1-192529 |
| Jul. 27, 1989 | [JP] | Japan | 1-192530 |

[51] Int. Cl.$^5$ .................. H01J 40/14; H01B 12/00
[52] U.S. Cl. .................. 505/1; 505/702; 250/211 J; 357/5
[58] Field of Search .................. 505/1, 701, 702, 726, 505/848, 849, 864, 865, 874; 357/5, 30, 83; 250/336.2, 211 J; 307/311, 306

[56] References Cited

U.S. PATENT DOCUMENTS

| 4,334,158 | 6/1982 | Faris | 357/5 |
| 4,521,682 | 6/1985 | Murakami et al. | 250/208.1 |
| 4,814,598 | 3/1989 | Faris | 357/5 |
| 4,843,446 | 6/1989 | Nishino et al. | 357/5 |
| 4,942,142 | 7/1990 | Itozaki et al. | 505/702 |
| 4,963,852 | 10/1990 | Drehman | 505/1 |
| 4,970,395 | 11/1990 | Kruse, Jr. | 505/701 |
| 4,990,487 | 2/1991 | Masumi | 250/211 J |
| 5,011,818 | 4/1991 | Katoka et al. | 505/1 |

FOREIGN PATENT DOCUMENTS

| 0248870 | 8/1987 | Fed. Rep. of Germany | 505/848 |
| 64-50486 | 2/1989 | Japan | |
| 0088318 | 4/1989 | Japan | 505/848 |

OTHER PUBLICATIONS

Clarke, "Small-scale analog applications of high-transmition-temperature superconductors", *Nature* vol. 333, May 5, 1988, pp. 29-35.

Cirovic et al., *Electronic Devices, Circuits, and Systems* 3rd Ed., 1987, pp. 128-131.

Nakane et al., "DC-SQUID with High-Critical-Temperature Oxide-Superconductor Film", Japanese J. of Appl. Phisc., 1987, pp. L1925-L1926.

Higashino et al., "Observation of the Josephson Effect in Y-Ba-Cu-O Compound", Japanese J. of Appl. Physics, 1987, pp. L1211-L1213.

Primary Examiner—David C. Nelms
Assistant Examiner—Michael Messinger
Attorney, Agent, or Firm—Fitzpatrick, Cella, Harper & Scinto

[57] ABSTRACT

A light detecting device includes a signal input portion which generates a current upon input of a light signal, a signal detecting portion including a superconductor which detects the light signal with injection of the generated current, and electrodes through which the generated current is injected into the superconductor.

20 Claims, 23 Drawing Sheets $I_J$ : MAGNETIC FIELD = 0
$I_J'$ : MAGNETIC FIELD ≠ 0

LIGHT DETECTING DEVICE AND LIGHT DETECTING METHOD USING A SUPERCONNECTOR

BACKGROUND OF THE INVENTION

1. Field of the Invention

The present invention relates to a light detecting device and a light detection method which employ a superconductor, and more particularly, to a light detecting device and a light detection method which employ a Josephson junction.

2. Description of the Related Art

Signal detecting devices which utilize a superconductor, particularly, light signal detecting devices which utilize a superconductor, have been known [Japanese Journal of Applied Physics vol. 23 L333 (1984). Such light signal detection devices (shown in FIG. 30) have a microbridge type Josephson junction 192 which is formed of an oxide superconductor $BaPb_{0.7}Bi_{0.3}O_3$ (BPBO) thin film 191, and utilize changes in the critical current of the Josephson junction caused by the radiation illuminated on the junction by means of an optical fiber 190. In the above-described detection device, a light-receiving portion is made of BPBO 191 having a critical temperature of about 13 K. In other words, liquid helium or the like must be used to operate the detecting device. Furthermore, the characteristics of the detecting device are dependent on those of the Josephson junction.

In the above-described conventional detecting device, the optical characteristics (e.g., spectral characteristics) of the device are determined by the spectral characteristics of the superconductor employed, i.e., wavelengths of the light to be detected are limited by the spectral characteristics of the superconductor, and detection of signals over a wide wavelength range is difficult.

Furthermore, in a case where the above-described detecting device is operated as a recording device, a semiconductor memory, or a Josephson memory, since it is operated by means of an electrical signal, it is easily affected by electrical noises caused by the extension of wiring.

Furthermore, in a case where the above-described detecting device is used together with a large number of other detecting devices, as in an image sensor, it is difficult to compensate for variations in the characteristics of the individual detecting devices caused during the manufacture thereof.

Furthermore, since the area of the junction to which radiation is applied is limited, highly accurate positioning is required.

The above-described conventional detecting device requires light having an intensity high enough to cause sufficient change in the critical current in the Josephson junction, which is difficult, and thus has a deteriorated sensitivity.

Furthermore, the use of the same Josephson junction as a light-receiving portion and a light detecting portion causes variations in the characteristics of the device.

Japanese Patent Laid-Open No. 50486/1989 discloses a light switching device (shown in FIG. 31) in which a PN semiconductor light signal sensing portion 204 is provided on a Josephson junction 203 of a superconductor 202 provided on a substrate 201. However, in such a light switching device, since the semiconductor light signal sensing portion 204 is directly laid over the Josephson junction 203 as if it covers the entirety of the Josephson junction 203, the light signal detecting sensitivity of the Josephson junction 203 is deteriorated. Furthermore, since the area of the Josephson junction 203 is very small, the semiconductor light signal sensing portion 204 formed on the Josephson junction 203 is also small, making introduction of light into such a small area with a high degree of accuracy difficult.

SUMMARY OF THE INVENTION

An object of the present invention is to provide a light detecting device and a light detecting method which enable the aforementioned conventional problems to be solved.

Another object of the present invention is to provide a light detecting device and a light detecting method which have a simple configuration and which exhibit excellent light signal detection sensitivity.

To achieve the above-described objects, the present invention provides a light detecting device which comprises a signal input portion which generates a current when a light signal is input thereto, a signal detecting portion which employs a superconductor which detects the light signal with injection of the generated current, and electrodes through which the generated current is injected into the superconductor.

In preferred embodiment, the present invention provides a light detecting device comprising a signal input portion which generates a current when a light signal is input thereto, and a signal detecting portion which employs a superconductor which detects a magnetic field created by the current.

DETAILED DESCRIPTION OF THE PREFERRED EMBODIMENTS

Figure 1:
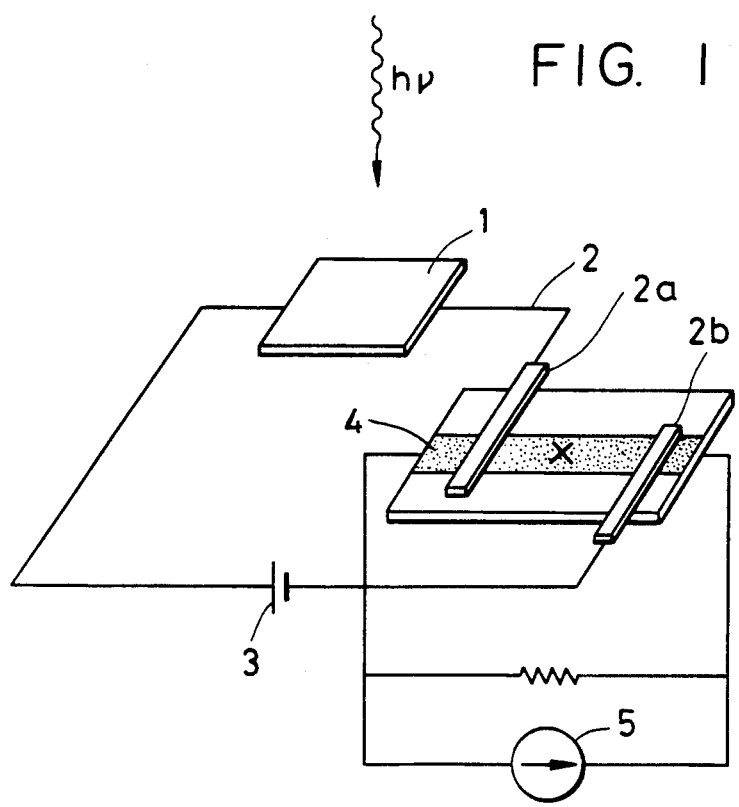
FIGS. 1, 2, 3 and 4 illustrate the principle of the operation of the present invention.

The first feature of the present invention is that a signal input portion to which a light signal is input and a signal detecting portion for detecting the light signal are provided as independent means. More specifically, the signal input portion and the signal detecting portion are basically formed of different materials and have separate functions.

The second feature of the present invention resides in the form in which the signal input portion and the signal detecting portion are arranged. In the first arrangement, the signal input portion and the signal detecting portion are disposed separately, although they are electrically connected by means of electrodes. In the second arrangement, the signal input portion and the signal detecting portion are electrically insulated and are separated from each other (although the signal detecting portion is brought close to the area such that it is within a magnetic field generated by the current which flows in the signal input portion).

In the present invention, since the signal input portion and the signal detecting portion are provided as independent means, the overall configuration can be simplified, and the area of the signal input portion (the light-receiving portion) can be increased, eliminating highly accurate positioning of an input light. Furthermore, since the signal input portion can be made of a material that can cope with light over a wide wavelength range, limitation to the wavelength range of the input light is eliminated.

Furthermore, in the present invention, since the signal input portion and the signal detecting portion are separated from each other (are not in contact with each other), there is no deterioration in the Josephson junction which may be caused during the formation of the signal input portion and excellent detection sensitivity can thus be obtained. In terms of the detection sensitivity, the second arrangement, i.e., a detecting device of the type which detects a magnetic field, is more desirable.

The present invention will now be described in detail.

In the present invention, any material, which is capable of coping with a light signal lying over a wide wavelength area, including infrared light, visible light and ultraviolet light, and which is capable of generating a current or a voltage with illumination of light, can be employed as the material of the signal input portion. In particular, photoconductive materials are desirable. Examples of the photoconductive materials which generate a large amount of light current include InSb, Si, GaAs, a-Si, CdS, CdSe, and Ge.

In addition to the materials which generate a large amount of current due to the photoconductive effect, materials which generate a large amount of current due to the photovoltaic effect and the Dember effect can also be employed.

Examples of the materials which generate a photoelectromotive force include a PN junction made of Si or a-Si and a Schottky junction.

Any material, single crystal or polycrystal, which exhibits superconductivity can be used as the material of the signal detecting unit. In terms of the operation of a detecting device at a higher temperature, materials having a high critical temperature are preferably employed. Suitable materials include those having a critical temperature higher than the boiling point of liquid nitrogen which is 77 K., such as Y-Ba-Cu-O type ceramics, Bi-Sr-Ca-Cu-O type ceramics, and Tl-Ba-Ca-Cu-O type ceramics.

Although the detecting device can be operated at temperatures lower than the critical temperature of the superconductor employed, it is preferable that the detecting device is operated at a temperature close to the critical temperature from the viewpoint of improving the detection sensitivity of an input signal.

The signal detecting portion can have any form or configuration so long as it enables the characteristics thereof to be changed with injection of a current or a magnetic field. Examples of the suitable configurations include a microbridge Josephson junction, a superconductor-insulator-superconductor (SIS) Josephson junction, a superconducting quantum interferometric device (SQUID) which utilizes quantization of a magnetic flux within a superconducting ring, and a thin superconducting wire. In the case of the SQUID, either a DC SQUID or an RF SQUID can be employed.

In a case where a Josephson junction is employed as the signal detecting portion, a microbridge type is easier to manufacture. However, a SIS device exhibits a detection sensitivity which is higher than that of the microbridge type. A SQUID assures a detection sensitivity which is higher than that obtained by the SIS device. Moreover, since the SQUID is also capable of detecting the intensity of light, a light signal can be detected in analog fashion (a signal magnitude detection) as well as digitally (ON/OFF detection).

Any conductive material can be used as the material of the electrodes which electrically connect the signal input portion and the signal detecting portion in the aforementioned first arrangement of the present invention. Examples of such materials include metals such as Au (Au—Cr). There is no limitation to the form of the electrode.

In the aforementioned first arrangement, the signal input portion and the signal detecting portion may be laid on top of each other with an electrode therebetween so long as they are not in contact with each other. In that case, the signal input portion must be cooled when the signal detecting portion is cooled. Therefore, the arrangement in which the signal input portion is disposed outside of a cooling device in which the signal detecting portion is housed and in which the signal input portion and the signal detecting portion are connected by means of electrodes (conductors) is preferable because the signal input portion can be operated at room temperatures and the operation efficiency can thus be improved. This also allows the use of materials, such as SdS or a-Si, which cannot be used at a very low temperature but are desirable from the viewpoint of improving sensitivity.

In the aforementioned second arrangement of the present invention, it is not necessary for the signal input portion to be disposed adjacent to the signal detecting portion so long as the signal detecting portion is disposed adjacent to a magnetic field generating portion electrically connected to the signal input portion for generating a magnetic field when a current generated in the signal input portion flows therein, i.e., so long as the signal detecting portion is disposed within a generated magnetic field. The magnetic field generating portion may be made of the same material as that of the electrode employed in the first arrangement and have the same shape, so long as it is electrically insulated from the signal detecting portion. Furthermore, since it is not necessary for the connection between the electrode and the superconductor to be optimized, the range of selection of the material is widened. Furthermore, in the second arrangement, the signal input portion and the signal detecting portion may be laid on top of each other with the insulator therebetween. In that case, the signal input portion must be cooled when the signal detecting portion is cooled. Therefore, the arrangement in which the magnetic field generating portion is provided in the signal input portion and in which the signal input portion is disposed outside of a cooling device in which the signal detecting portion is housed is preferable for the same reason as that explained in the description on the first arrangement.

In the present invention, a small heater for heating only the signal input portion may be provided in order to improve the detection sensitivity of the signal input portion. Furthermore, the devices according to the present invention may be integrated one-dimensionally or two-dimensionally to provide a line sensor or a plane sensor. In the detecting device according to the present invention, since the SQUID can be employed in the signal detecting portion, it is possible to provide an optical sensor having an extremely high sensitivity.

Such an optical sensor may be incorporated into a system such as a spectroscope.

Furthermore, in the present invention, it is preferable that a bias current which is slightly smaller in an amount than the critical current of the superconductor that forms the signal detecting portion be made to flow in the signal detecting portion from the viewpoint of further improving the detection sensitivity.

In a preferred form, the detecting device according to the present invention includes a superconductor for confining the magnetic field created by the generated current due to the Meissner effect.

When the magnetic field confining superconductor provided separately from the aforementioned signal detecting superconductor in such a manner that it covers at least the signal detecting portion is in a state in which the Meissner effect is occurring, leakage of the generated magnetic field or adverse effect of the noises on the detector can be restricted.

This leads to improvement of the detection efficiency of the detector, and enables the concurrent use of a plurality of detectors.

The superconductor which forms the signal detecting portion and the magnetic field confining superconductor may be the same or different. However, the magnetic field confining superconductor must be a superconductor whose critical magnetic field has a magnitude larger than that of the generated magnetic field.

Next, the principle of the operation of the present invention will be described.

The first arrangement of the present invention utilizes the following phenomenon: when the signal input portion made of, for example, a photoconductive material is exposed to radiation, electrons in the valence band are excited and take on a new energy level (in the conduction band). When the electrons in the conduction band are moved by an electric field applied thereto, a light current flows.

When a current which is made to flow in a superconductor exceeds the critical current value of the superconductor, the superconductor undergoes the transition from the superconducting phase, and a voltage appears.

In FIG. 1, first, the signal input portion 1 made of a photoconductive material or a material which generates a photoelectromotive force is exposed to light.

In a case where the signal input portion 1 is made of a photoconductive material, exposure of the signal input portion 1 to the radiation increases the excess charge carriers and causes the electrons in the valence band to be excited across the forbidden band into the conduction band. When the electrons in the conduction band are moved by the electric field applied thereto by a d.c. voltage source 3, a light current flows in a conducting wire 2, and the generated current is injected into the signal detecting portion 4 (injected current $I_P$).

Injection electrodes $2a$ and $2b$ are provided at the signal detecting portion 4.

In a case where the signal input portion 1 is made of a material which generates a photoelectromotive force, such as a PN junction, d.c. voltage source 3 is not necessary, and the conductor 2 is made to form a continuous path for current.

A bias current $I_B$, which is smaller than a Josephson current $I_J$, is applied beforehand to the signal detecting portion 4 by means of a d.c. current source 5.

When $I_B+I_P>I_J$, the signal detecting portion 4 undergoes transition from a superconducting state to a voltage state.

Figure 2:
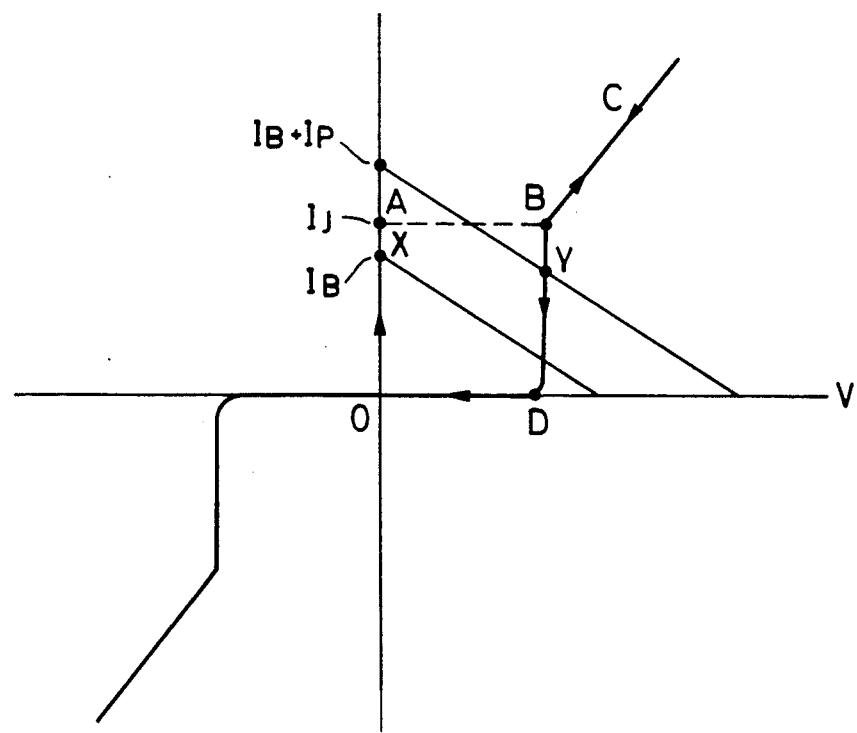

Such a switching operation is illustrated in the diagram of FIG. 2. When the signal detecting portion includes a SIS device, the operation of the SIS device follows a course of O - A - B - C - B - D - O. When $I_P=0$, the SIS device is at the operation point X (voltage=0), and when $I_P \neq 0$ and $I_B+I_P>I_J$, the SIS device is at point Y (voltage$\neq$0).

The second arrangement according to the present invention utilizes the following phenomenon: when the signal input portion made of, for example, a photoconductive material is exposed to radiation, electrons in the valence band are excited and take on a new energy level (in the conduction band). When the electrodes excited in the conduction band are moved by an electric field applied thereto, a light current occurs.

It is a well known fundamental law of physics that a current which flows in a substance has an associated magnetic field.

Superconductors are classified into two types: the type I which undergoes transition from a superconducting state to a nonsuperconducting state when a magnetic field having a magnitude larger than that of the magnetic field inherent in the material, i.e., that of the critical magnetic field, is applied thereto, and the type II which is invaded by part of a magnetic flux when the magnetic field having a magnitude larger than that of the magnetic field inherent in the material (Hc1) is applied thereto and which undergoes transition to a nonsuperconducting state when a magnetic field having a magnitude larger than that of another magnetic field inherent in the material (Hc2) is applied thereto. The present invention utilizes this physical phenomenon.

Figure 3:
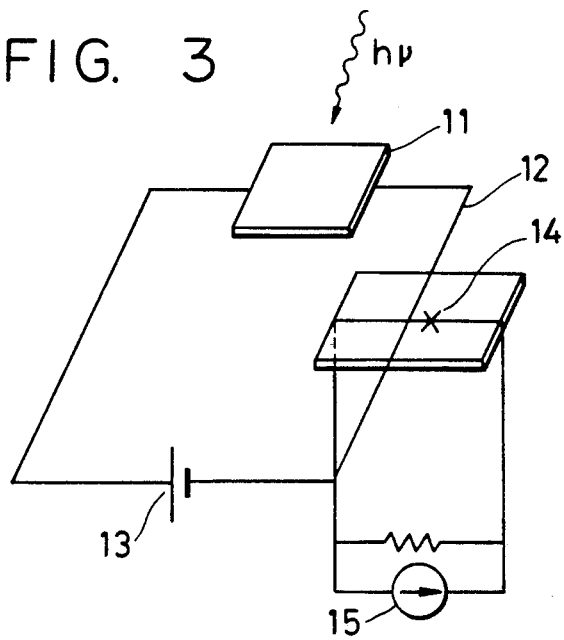

In FIG. 3, first, a signal input portion 11 made of a photoconductive material or a material which generates a photoelectromotive force is exposed to radiation.

In a case where the signal input portion 11 is made of a photoconductive material, exposure of the signal input portion 11 to the radiation increases the carriers, and causes the electrons in the valence band to be excited across the forbidden band into the conduction band. When the electrons in the conduction band are moved by the electric field applied thereto by a d.c. voltage source 13, a light current flows in a conducting wire 12.

In a case where the signal input portion 11 is made of a material which generates a photoelectromotive force, such as a PN junction, d.c. voltage source 13 is not necessary, and the conductor 12 is made to form a continuous path for current.

Figure 4:
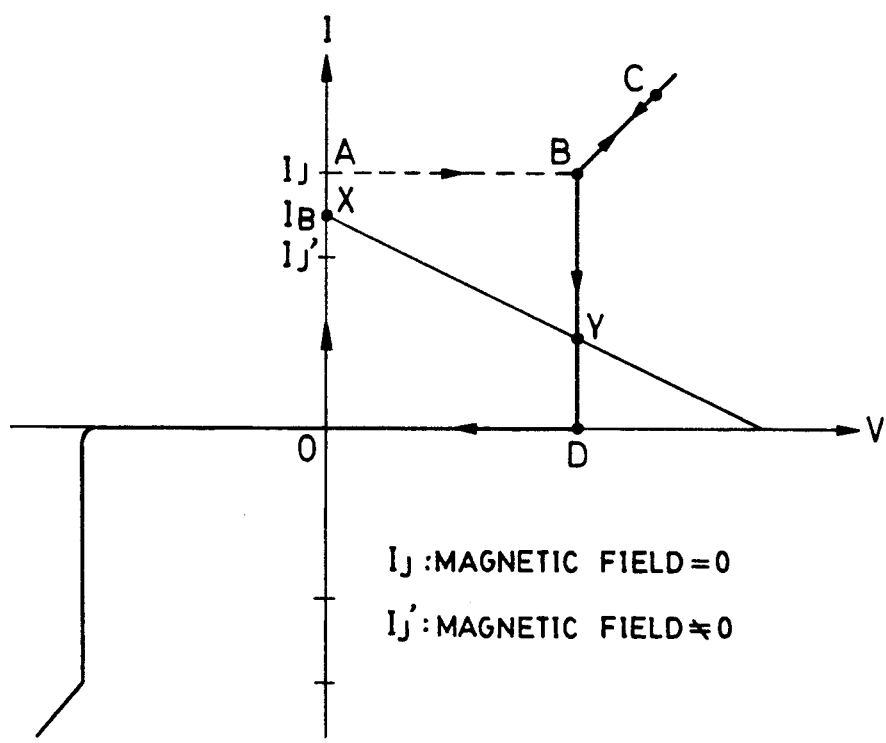

Josephson current which flows in a signal detecting portion 14 located in the vicinity of the conductor 12 varies from point $I_J$ (magnetic field=0) to $I_J'$ (magnetic field$\neq$0) due to the magnetic field associated with the current generated in the conductor 12, as shown in FIG. 4. Here, $I_J>I_J'$.

A bias current $I_B$ is applied beforehand to the signal detecting portion 14 by means of a d.c. current source 15. At that time, if $I_B$ has a relation expressed by $I_J'<I_B<I_J$, when the Josephson current in the signal detecting portion 14 varies from IJ to IB due to the illumination, the signal detecting portion 14 undergoes transition from a superconducting state to a voltage state.

Such transition is illustrated in the diagram of FIG. 4. When the signal detecting portion includes a SIS device, the operation of the SIS device follows a course of O - A - B - C - B - D - O. When magnetic field=0, the SIS device is at the operation point X (voltage=0), and when magnetic field≠0, the SIS device is at point Y (voltage≠0).

The above-described present invention has the following advantages.

1. When compared with the conventional device (in which, for example, a Josephson junction is exposed to radiation), positioning of a light signal onto the detecting device is facilitated, i.e., a signal can be input to an input portion (signal receiving portion) having an arbitrary size.
2. Since the range of selection of the material of the optical signal input portion (light-receiving portion) is widened, signals can be detected over a wider wavelength area.
3. Compared with a conventional device (in the conventional Josephson junction, the detection characteristics are determined by the junction characteristics, and there are variations in the characteristics of the individual devices of a multi-structure sensor), reproducibility and reliability are improved and variations in the characteristics are lessened. These facilitate integration of detecting devices.
4. In a case where SQUID is employed in the detecting portion, a high sensitivity is achieved as compared with the conventional device.
5. In a case where SQUID is employed in the detecting portion, a magnetic field surrounding a superconducting ring is detected. So, the intensity of light can also be detected.
6. Since the superconductor which forms the detecting portion is operated at a temperature closer to the critical temperature thereof, detection sensitivity can be improved.
7. In a case where the hysteresis inherent in a SIS device is utilized, the resulting light detecting device exhibits a high detection sensitivity which enables it to function as a storage device. In a case where the light detecting device is operated as a storage device, since a signal is light, the wiring on a substrate is lessened, resulting in a detection device which withstands electrical and magnetic noises well.
8. Since the magnetic field created by the current generated by radiation input is confined due to the Meissner effect of a superconductor, detection sensitivity can be improved, and mutual influence between the detectors can be eliminated. These enable integration of the detection devices and increase detection efficiency.
9. In the case where a signal detecting portion is disposed within a cooler while a signal input portion is disposed outside of the cooler, the signal input portion can be operated at room temperature and the operation efficiency can be improved.

The present invention will now be described below by way of example.

EXAMPLE 1

Figure 5:
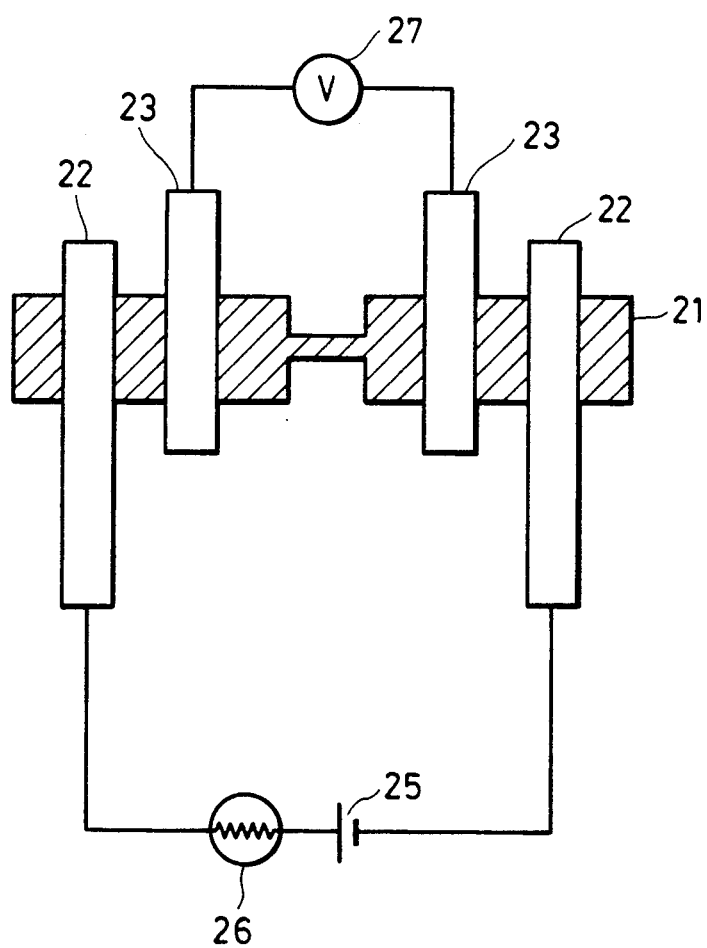
FIGS. 5, 6, 7, 8, 9, 10 (A) and (B), 11, 12 (A) and (B), 13, 14, 15, 16, 17, 18, 19, 20, 21, 22, 23, 24, 25, 26 (A) to (C), 27 (A) to (C), 28 (A) and (B), and 29 are respectively schematic views of embodiments according to the present invention.

FIG. 5 illustrates the concept of Example 1. In FIG. 5, a reference numeral 21 denotes a superconductor, 22; current injecting electrodes, 23; voltage measuring electrodes, 25; a photoconductive cell driving power source, 26; a photoconductive cell, and 27; a signal detecting voltmeter.

First, an oxide superconductor $YBa_2Ca_3O_{7-\delta}$ ($0 \leq \delta \leq 0.5$) was formed on a MgO substrate (not shown) by the magnetron sputtering technique or the like, and the obtained thin film was then processed by the photolithography technique or the like. In this Example, the oxide superconductor had a belt-like shape having a thickness of 5000 Å, a width of 2 mm and a length of 5 mm. The microbridge portion had a width of 8 μm and a length of 12 μm. Next, the current injecting electrodes 22 and the voltage measuring electrodes 23 of Cr, Au having a thickness of 1000 Å and a width of 50 μm were formed on the belt-like shape of the superconductor.

The critical temperature of the superconductor was 88 K. The signal detecting portion of this detecting device was immersed in liquid nitrogen (77 K.), and 10 V was then applied to the photoconductive cell driving power source 25. When the photoconductive cell 26 was not illuminated, 5 mA of dark current flowed in the photoconductive cell. Also, the signal detecting voltmeter 27 pointed 0 V, which means that the superconductor was in a superconducting state. When 5 mW of light was irradiated on the photoconductive cell 26 by means of a He-Ne laser at room temperature, the signal detecting voltmeter 27 indicated 2 V. This means that illumination of the photoconductive cell caused a current having a value larger than the critical current value to flow in the superconductor 21, and caused the superconductor 21 to undergo transition to a nonsuperconducting state.

EXAMPLE 2

Figure 6:
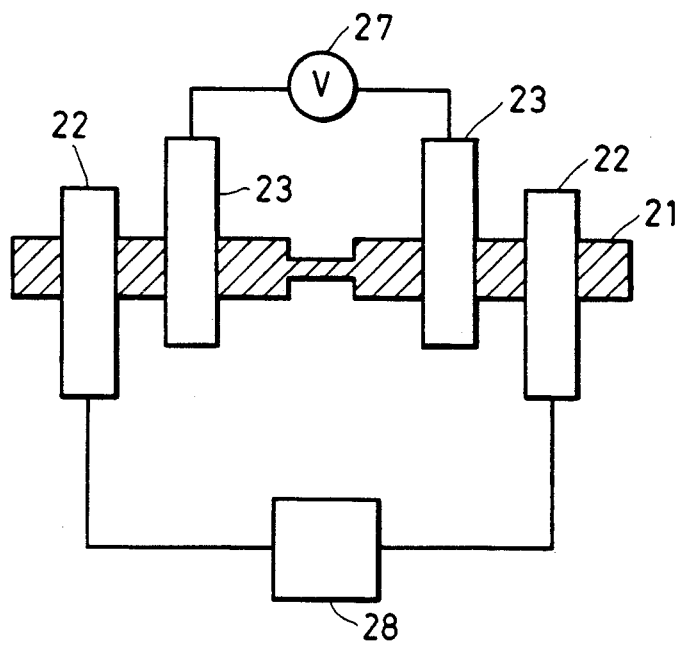

FIG. 6 shows Example 2 of the present invention. The signal receiving portion of this detecting device employed a PN junction 28 which utilized the photovoltaic effect. When the PN junction was not exposed to light in the liquid nitrogen, no voltage appeared. When the PN junction 28 was illuminated in the same manner as in the case of Example 1, a voltage appeared. This means that the current which flowed in the superconductor 21 increased due to the photovoltaic effect, and that the superconductor underwent transition to a nonsuperconducting state.

Light-receiving sensitivity will be improved by providing a small heater in the PN junction, as the photoconductive cell 26 was employed in Example 1.

EXAMPLE 3

Figure 7:
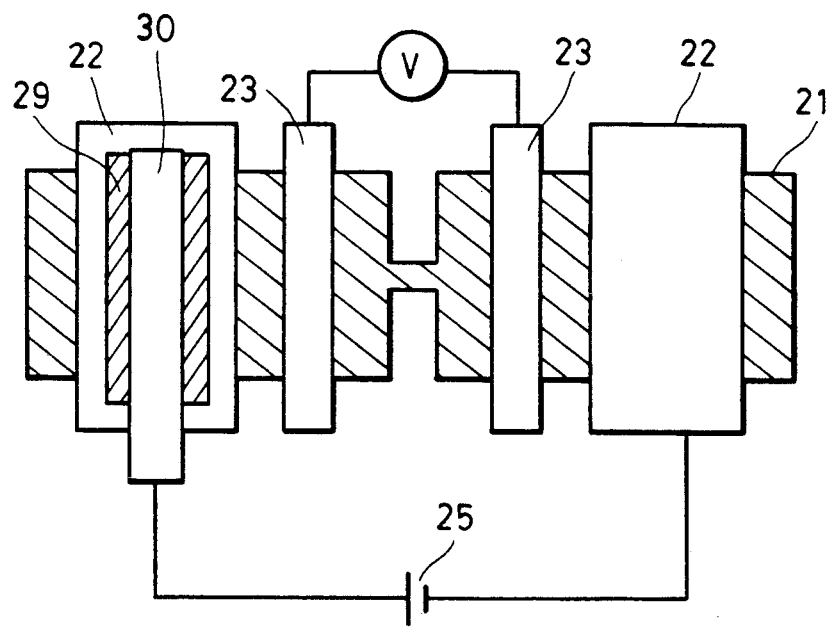

FIG. 7 shows Example 3 of the present invention. In this detecting device, a photoconductive thin film 29 (made of a-si) was formed on the current injecting electrode 22 of the signal detecting portion, and an electrode 30 was then formed on the photoconductive thin film 29. In other words, the signal input portion and the signal detecting portion were formed as one unit. When the same measurement as that conducted in Example 1 was conducted on this detecting device, the same results were obtained.

EXAMPLE 4

Figure 8:
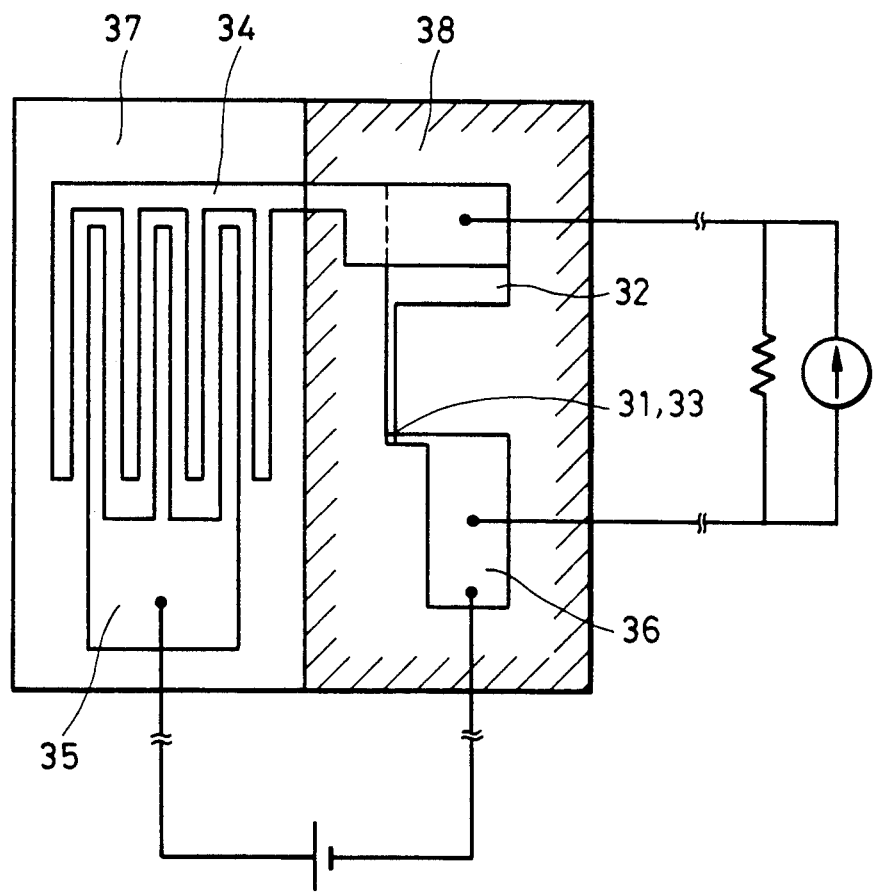

FIG. 8 shows Example 4 which employs the signal input portion made of Si and a Nb/Al-AlOx/Nb SIS device.

First, an insulating film 38 ($SiO_2$) was formed to a thickness of 1000 Å on half of a non-doped Si wafer substrate 37 (100 plane), and a lower electrode 36 (Nb), an insulating layer 31 (Al-AlOx), and an upper electrode 32 (Nb) were then formed on the insulating film 38 by the known technique to form an SIS device 33 having a junction area of 5 μm×5 μm. Next, the portion of the Si wafer 37 which was not covered by the insulating film 38 was processed using hydrofluoric acid, and comb electrodes 34 and 35 (Cr/Au) were then formed to a thickness of 1500 Å using a metal mask, as shown in FIG. 8. The length of the comb electrodes was 4 mm, the distance between the adjacent electrodes was 0.1 mm, and the light-receiving area of the comb electrodes was 0.05 cm$^2$. In this way, ohmic contact was achieved between the Si and the Cr/Au. When light response of the thus-manufactured light detecting device was estimated, switching of the SIS device (0 mV to 2,8 mV) could be confirmed at a temperature of 4.2 K. with a bias current of 1.2 mA, 0.3 mW of illumination by means of a He-Ne laser (with a wavelength of 633 nm), and a comb electrode applied voltage of 10 V.

EXAMPLE 5

Figure 9:
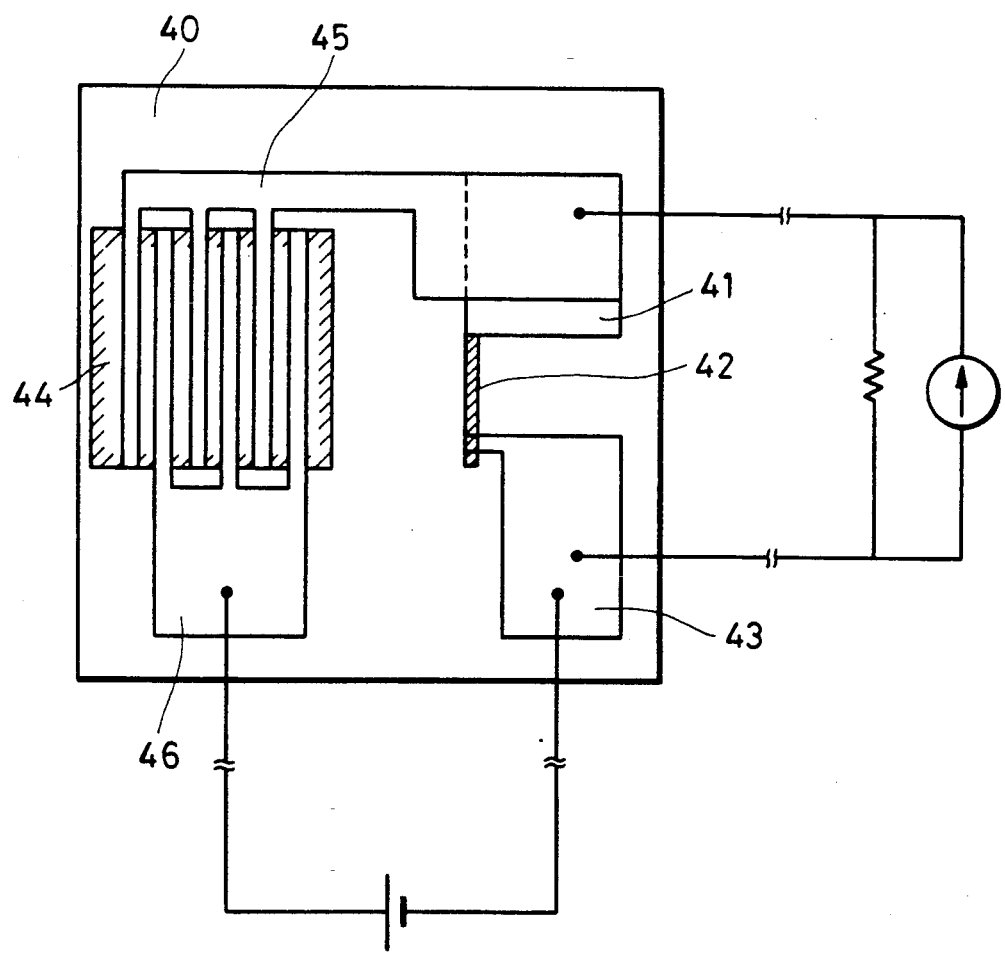
Figure 10:
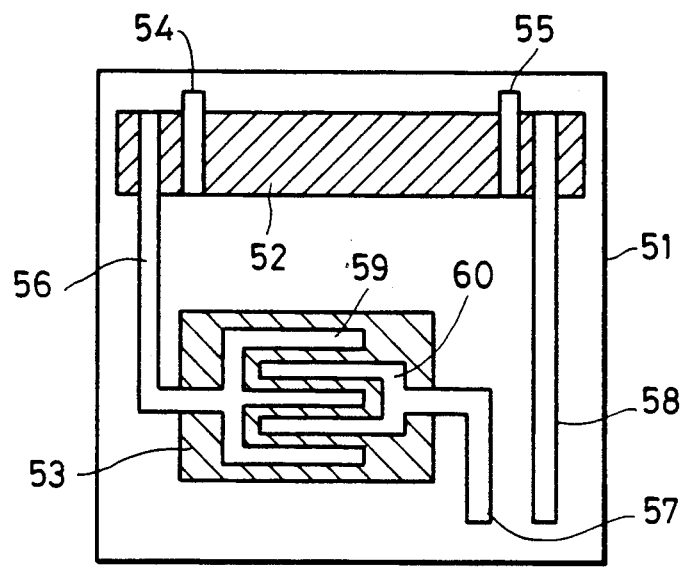
Figure 10:
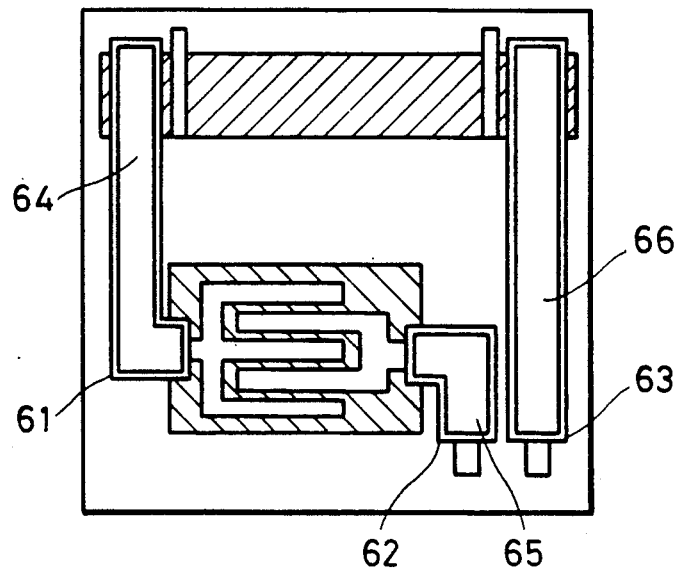

FIG. 9 shows a light detecting device which employs amorphous Si in the signal input portion and a Y-Ba-Cu-O/silver oxide/Pb SIS device.

First, a lower electrode 41 was formed by depositing Y-Ba-Cu-O oxide superconductor to a thickness of 5000 Å on a MgO substrate (100 plane) 40 in argon and oxygen by means of the RF magnetron sputtering technique while maintaining the temperature of the substrate 40 to 550° C., and an insulating layer (Ag/Ag$_2$O) 42 was then formed to a thickness of 100 Å in argon and in vacuum while maintaining the temperature of the substrate to 100° C. Next, Ag was oxidized by introducing oxygen while heating to a temperature of 400° C. Thereafter, a bridge pattern (41 and 42 in FIG. 9) having a width of 10 μm was formed by the photolithography process. Next, an upper electrode 43 (Pb) was deposited to a thickness of 500 Å using a metal mask. The portion of the upper electrode 43 which was laid on the bridge pattern had a width of 100 μm and a junction area of 100 μm×10 μm. The effective area was an order of magnitude less due to non-uniformity of the Ag oxide film. Next, amorphous Si 44 was deposited to a thickness of 2000 Å in an area of 2 mm×2 mm by the CVD process to form a signal input portion, and comb electrodes 45 and 46 (Cr/Au) were finally formed to a thickness of 500 Å. When light response of the light detecting device manufactured in the manner described above was estimated, switching (0 mV to 20 mV) of the SIS device could be confirmed at a temperature of 4.2 K. and with a bias current of 0.75 mA, 0.3 mW of illumination by means of a He-Ne laser (with a wavelength of 633 nm), and a comb electrode applied voltage of 10 V.

EXAMPLE 6

The detecting device of Example 6 was manufactured in the same manner as Example 5 with the exception that a PN junction was formed by forming N type amorphous Si to a thickness of 1500 Å and then by forming P type amorphous Si to a thickness of 1500 Å on the N type amorphous Si, and that the upper electrode 43 (Pb) and the comb electrode 46 were short-circuited. When a bias current of 0.8 mA was applied to this device at a temperature of 4.2 K. and 3 mW of light was irradiated on the device by means of a He-Ne laser (with a wavelength of 633 nm), switching (0 mV to 20 mV) of the SIS device could be confirmed.

EXAMPLE 7

Figure 10A:
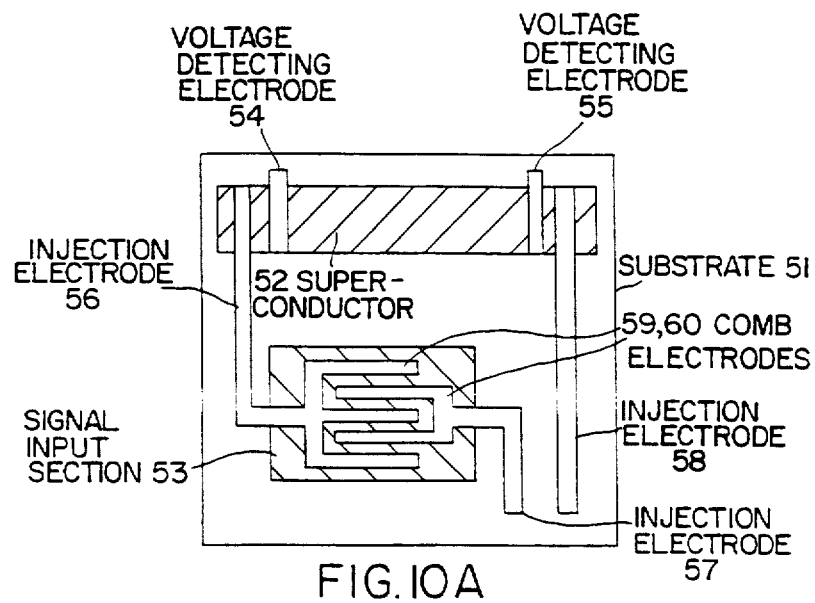
Figure 10B:
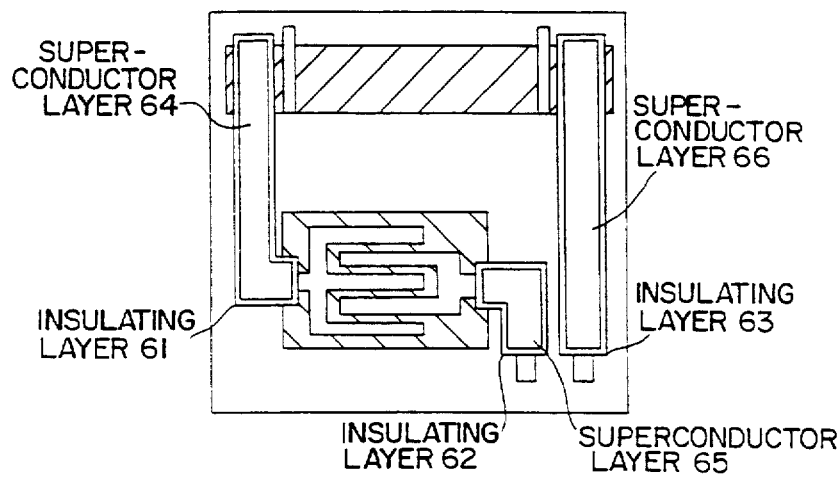
Figure 11:
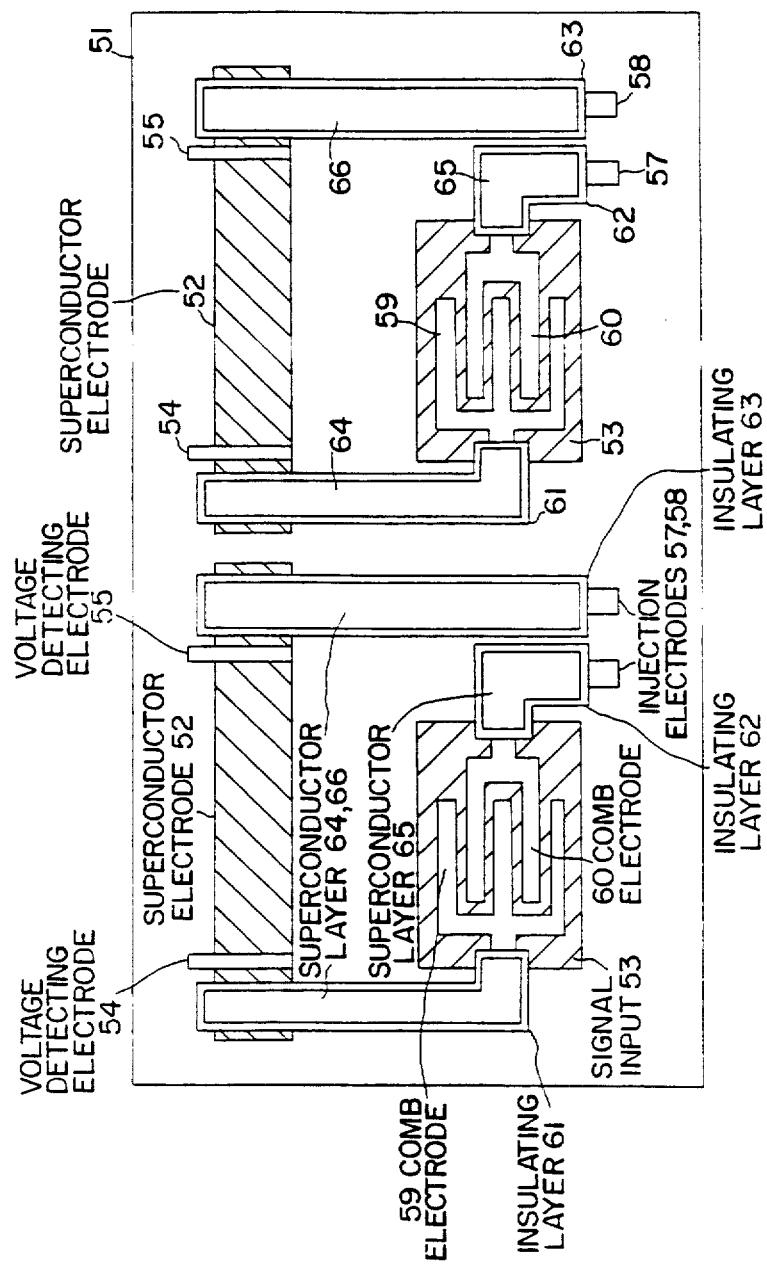

FIGS. 10A and 10B show the concept of and manufacture process of Example 7.

First, a superconducting electrode 52 which served as a signal detecting portion was formed by depositing Y$_1$Ba$_2$Cu$_3$O$_{7-x}$ ($0 \leq x \leq 0.5$) superconducting thin film to a thickness of 5000 Å on a MgO substrate 51 by the magnetron sputtering process and then by conducting patterning on the superconducting thin film by the photolithography technique so that the thin film had a width of 20 μm and a length of 1 mm. Next, a CdS thin film was deposited to a thickness of 1 μm in an area of 0.8 mm×0.8 mm on the portion of the MgO substrate where no electrode was formed to form a signal input portion 53. Next, a Pt thin film was deposited by the ion beam sputtering technique to form voltage detecting electrodes 54, 55, current injecting electrodes 56, 57 and 58, and comb electrodes 59 and 60. Thereafter, a MgO thin film was deposited to a thickness of 8000 Å on the current injecting electrodes 56, 57 and 58 by the magnetron sputtering process to form insulating layers 61, 62 and 63, as shown in FIG. 10B, and magnetic field confining superconducting layers 64, 65 and 66 were then formed on the insulating layers 61, 62 and 63 in the same manner as that in which the superconducting electrode 52 was formed.

In the thus-manufactured detecting device, all the superconductors were in a superconducting state at a temperature of 82 K. The light detecting device was cooled to 77 K. by immersing it in liquid nitrogen.

When 10 V was applied between the current injecting electrodes 57 and 58 in a state no light was irradiated on the signal input portion 53, no voltage appeared between the voltage detecting electrodes 54 and 55. When 5 mW of light was irradiated on the signal input portion 53 by means of a He-Ne laser and the current which flowed in the superconducting electrode 52 thereby exceeded the critical current value thereof, the superconducting electrode 52 underwent a transition to a voltage state, and 10 mV of voltage thus appeared.

EXAMPLE 8

Figure 11:
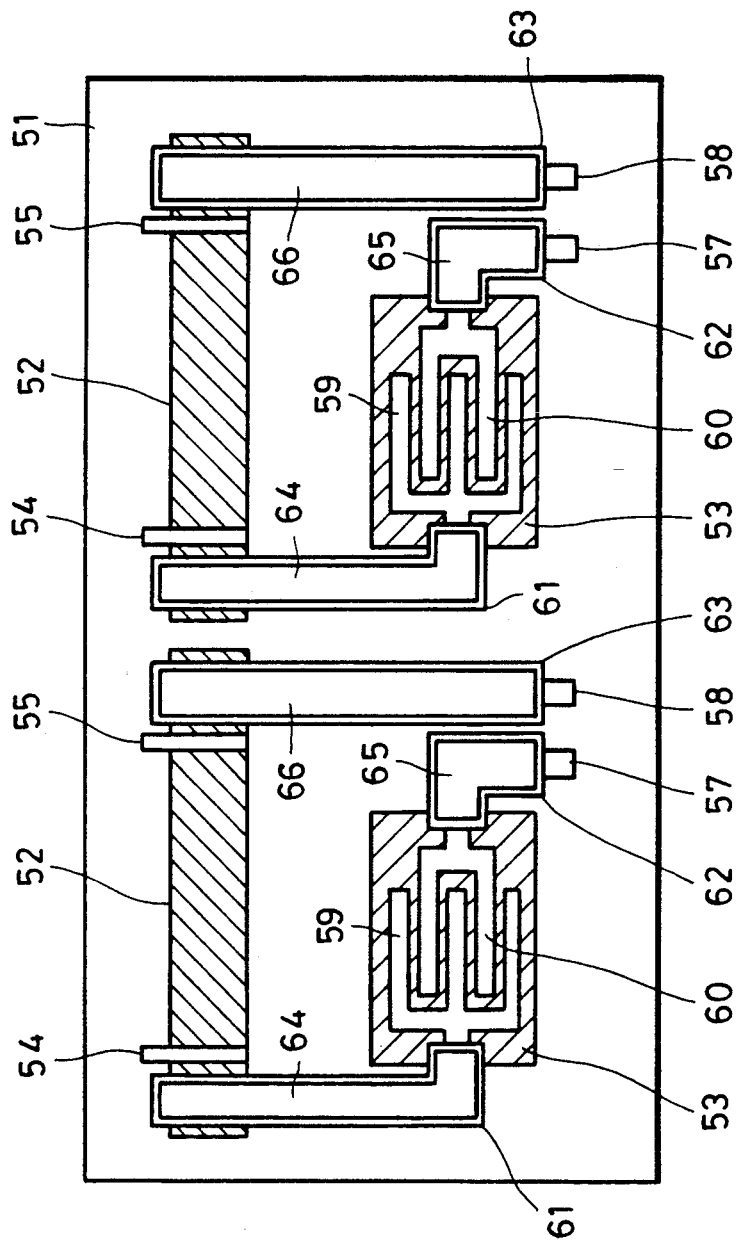
Figure 12:
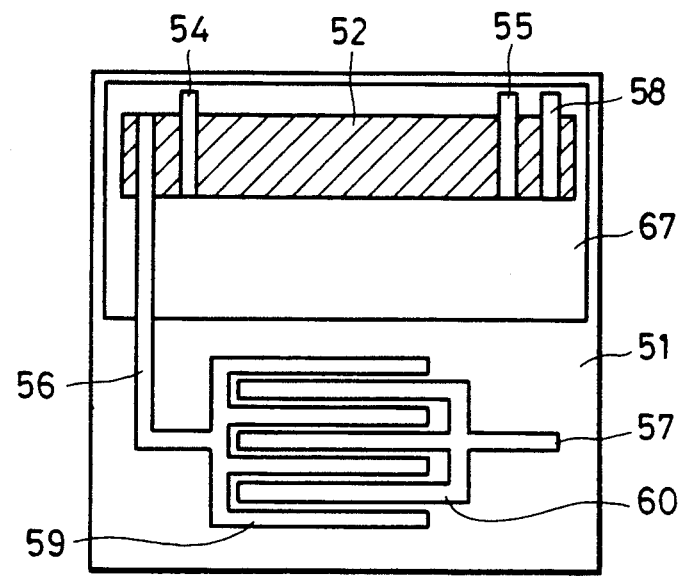
Figure 12:
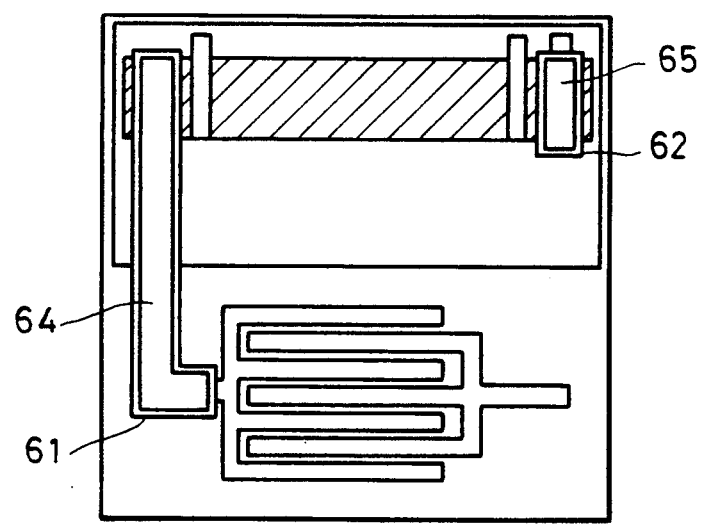

FIG. 11 shows Example 8 in which two detecting devices having the same configuration as that employed in Example 7 are disposed very close to each other such that the distance between the superconducting electrodes 52 of the two detecting devices is 10 μm.

When one of the light input portions was illuminated in the same manner as in Example 7, the same results as those obtained in Example 7 were obtained in the illuminated light detecting device. The other light detecting device was not affected by this at all.

EXAMPLE 9

Figure 12A:
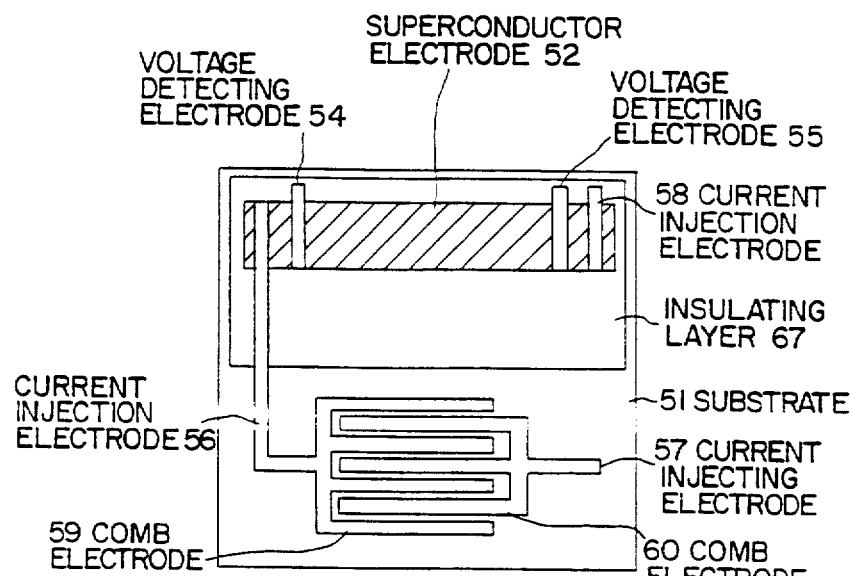
Figure 12B:
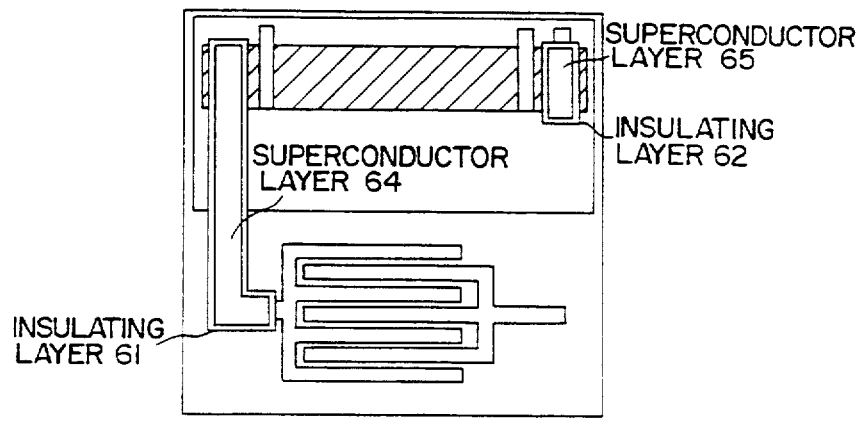
Figure 13:
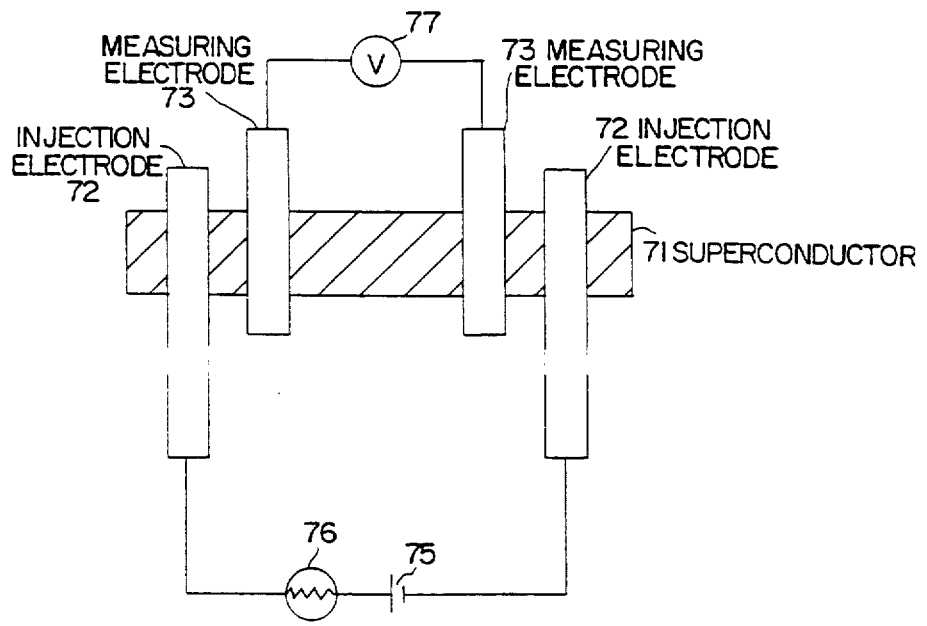
Figure 14:
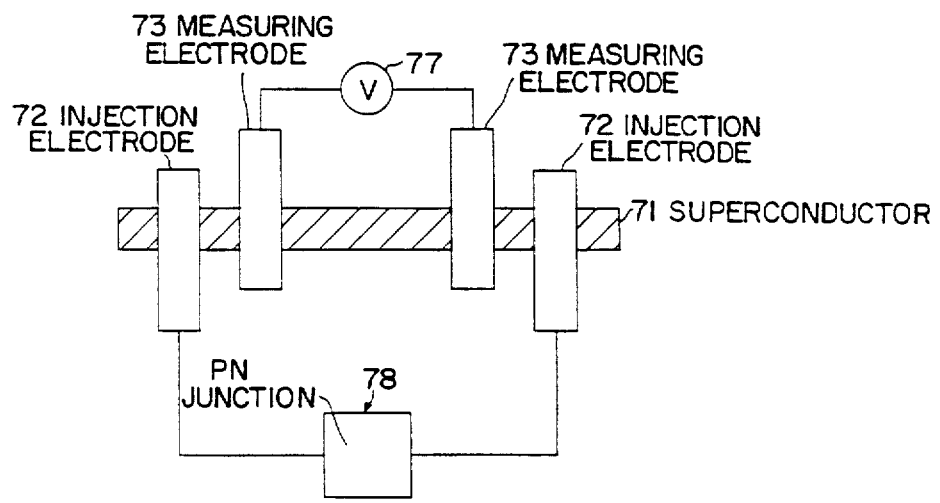
Figure 15:
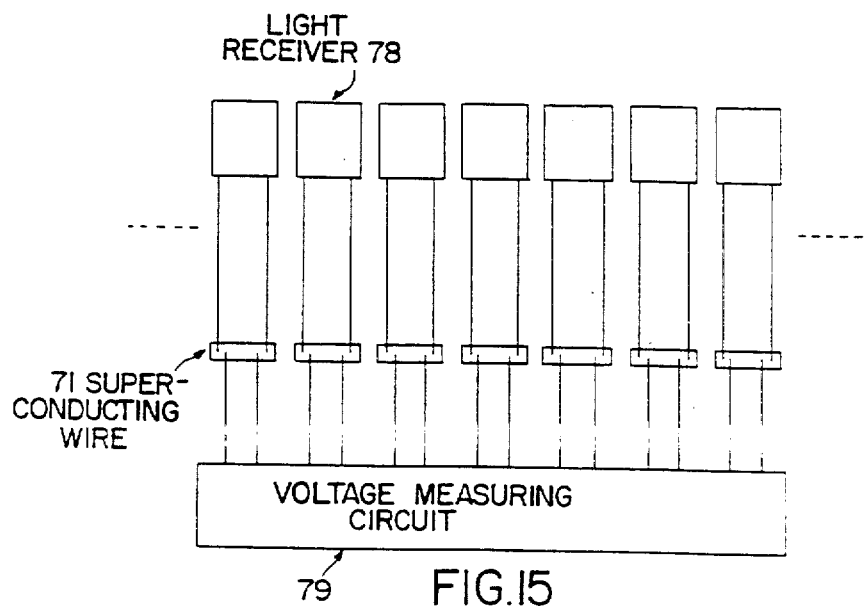
Figure 16:
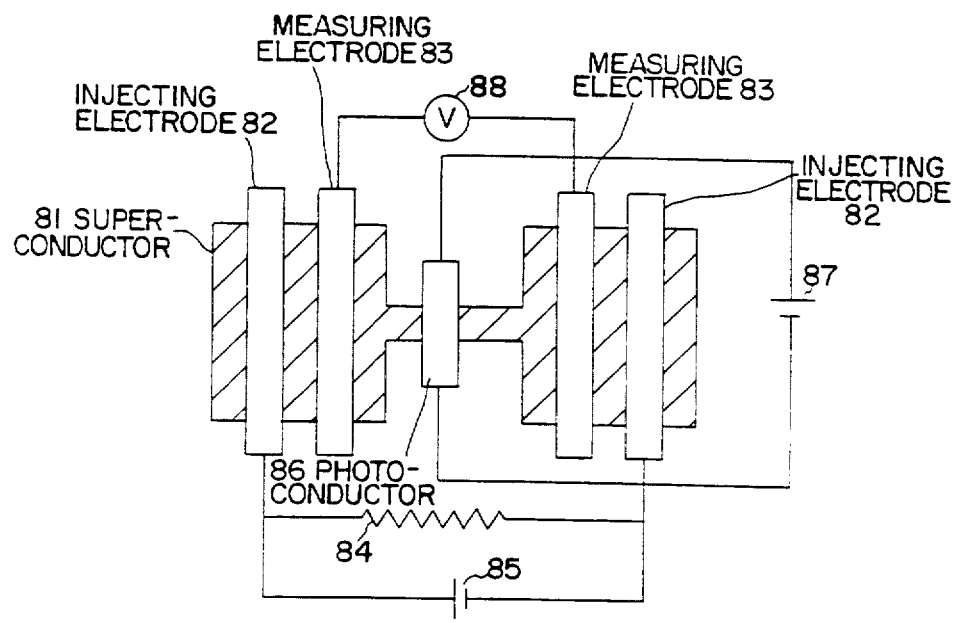
Figure 17:
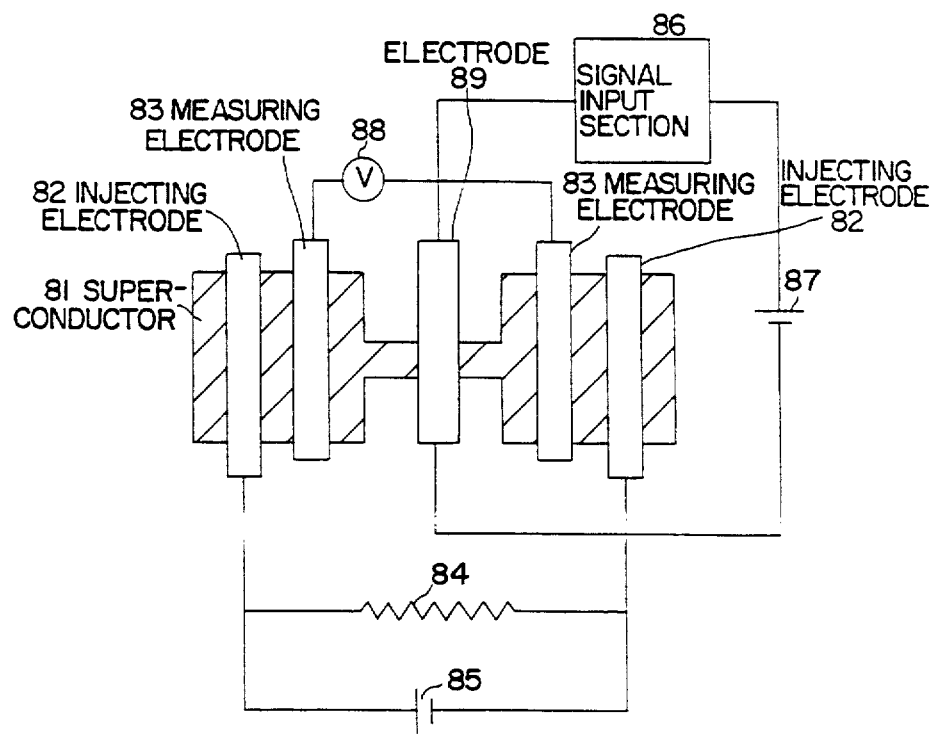
Figure 18:
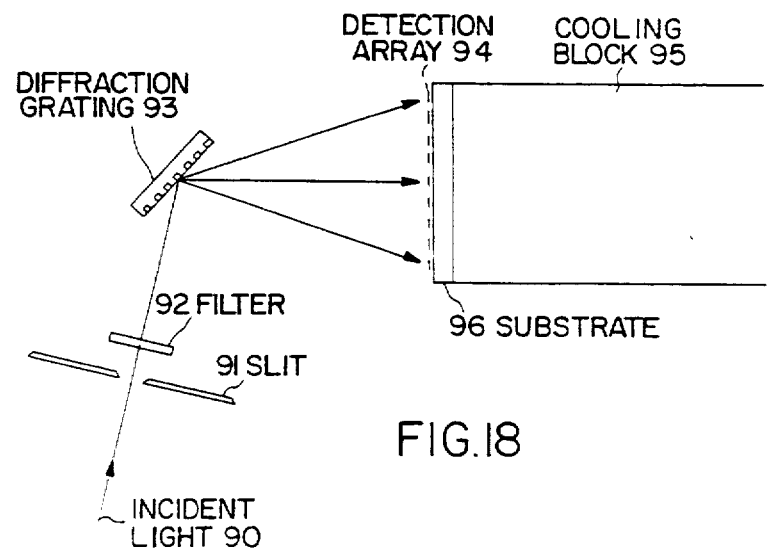
Figure 19:
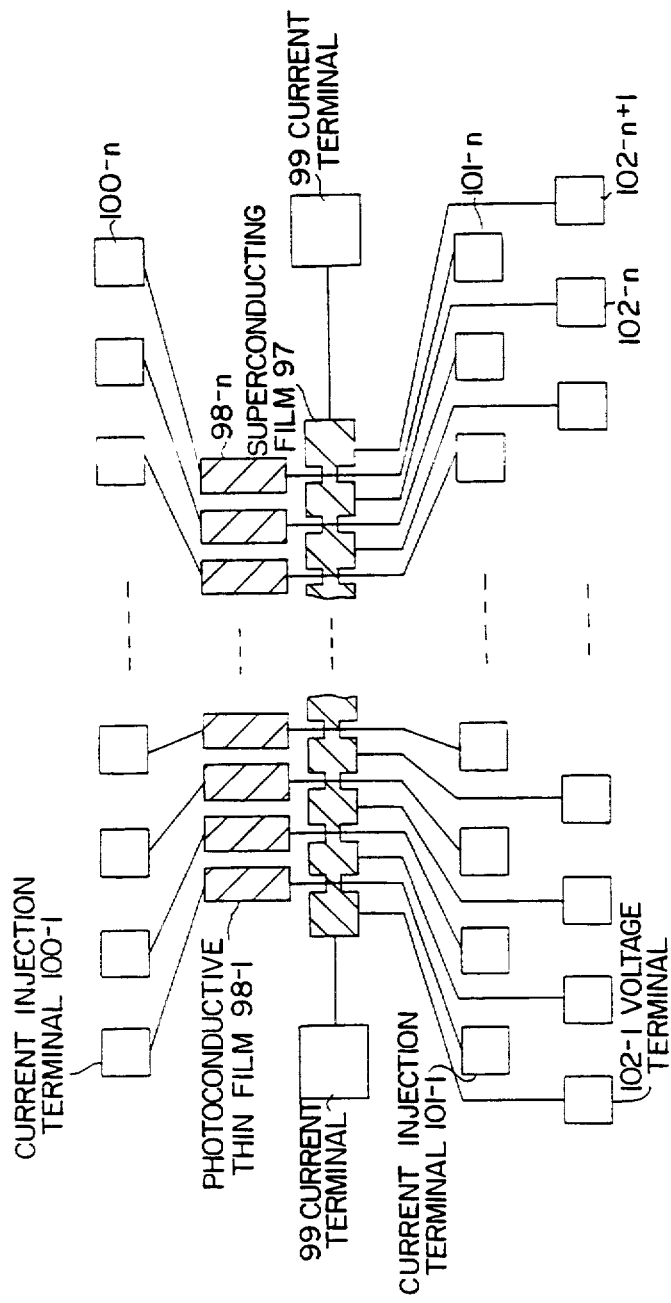
Figure 20:
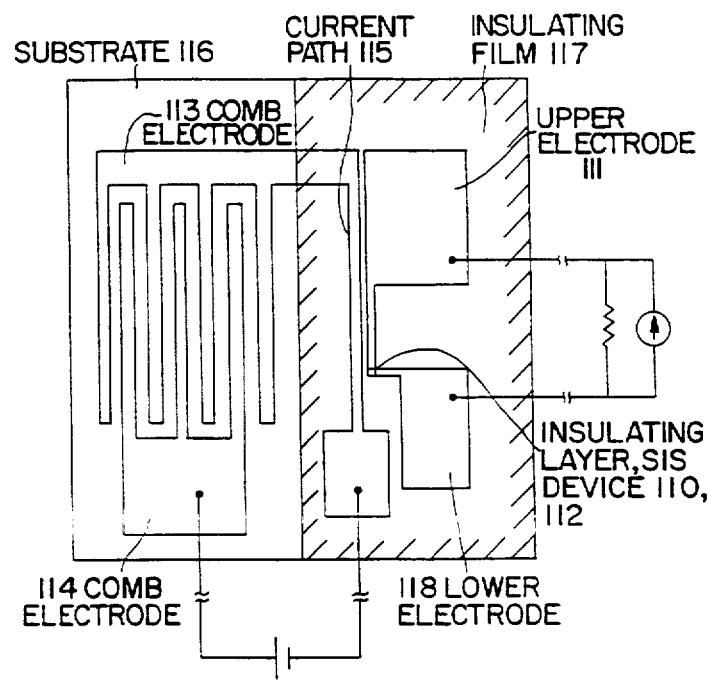
Figure 21:
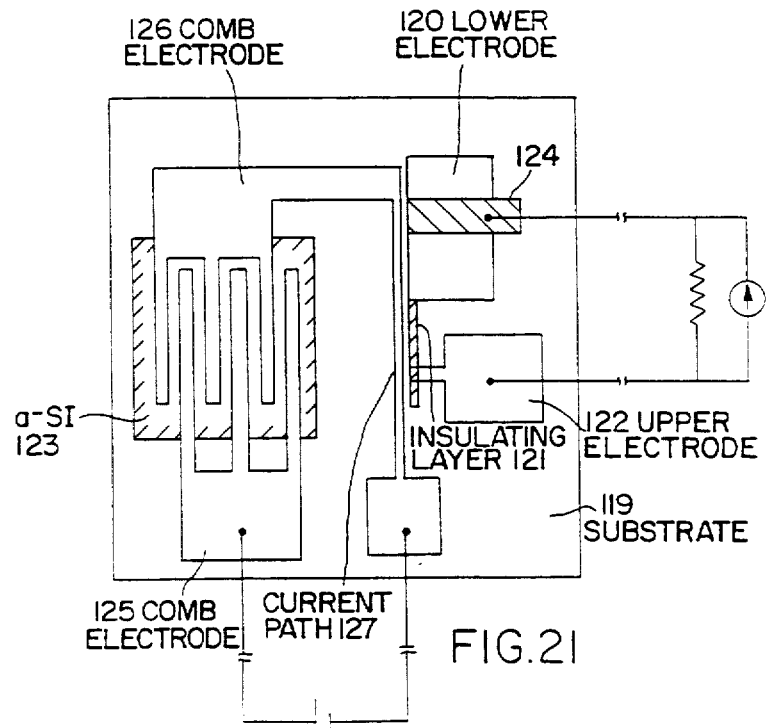
Figure 22:
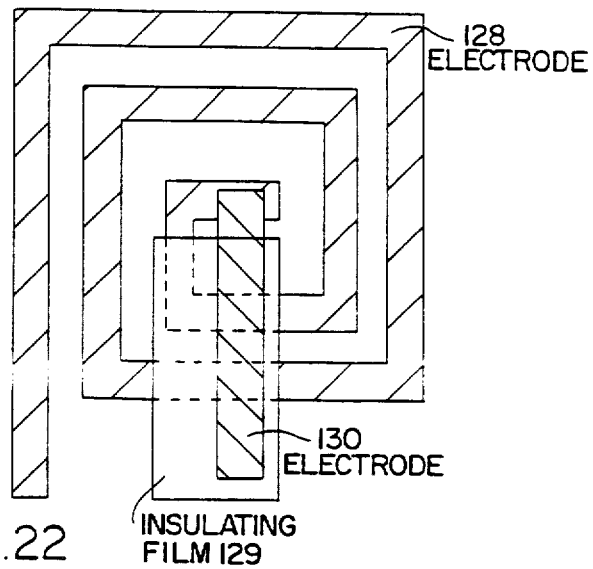
Figure 23:
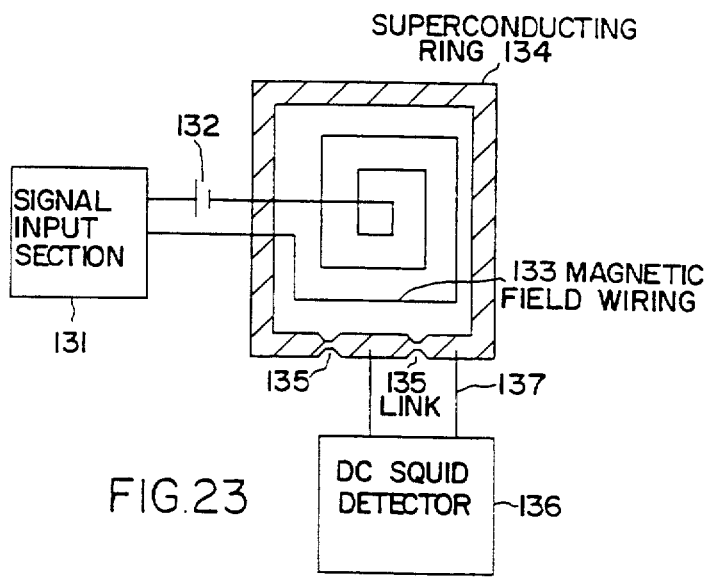
Figure 24:
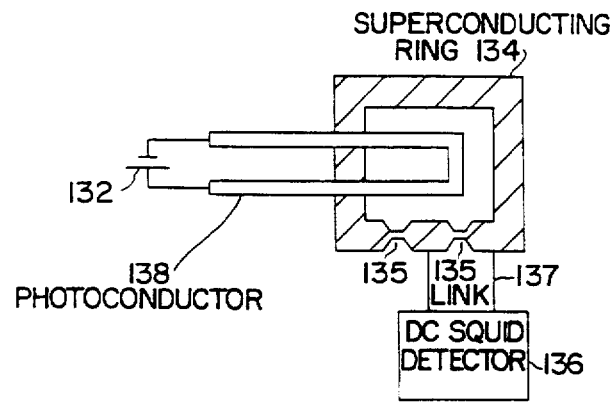
Figure 25:
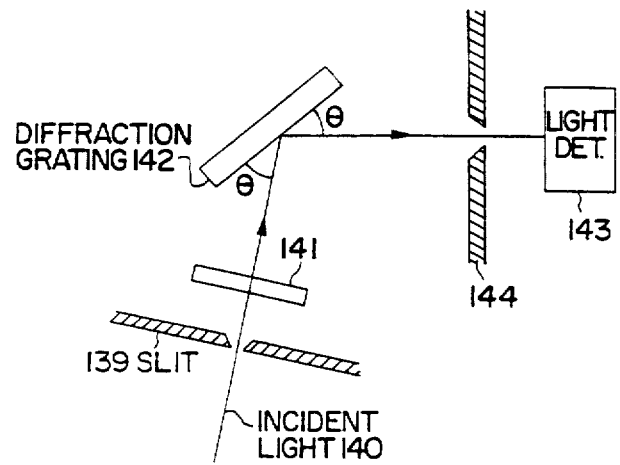
Figure 26A:
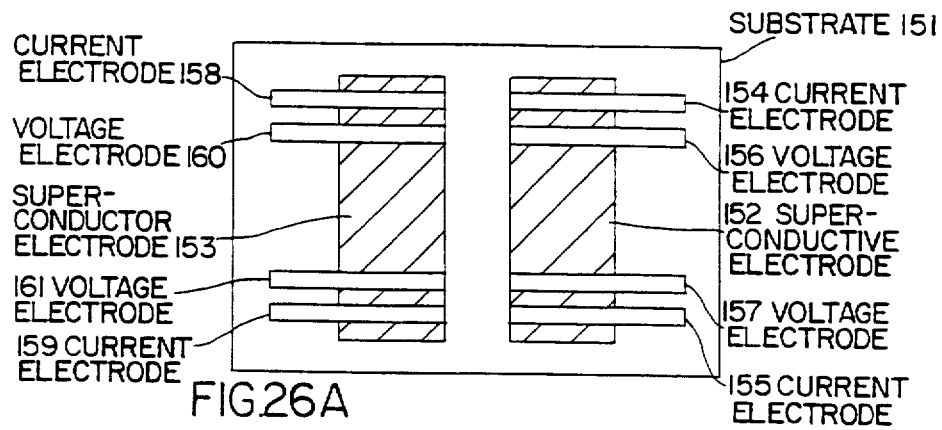
Figure 26B:
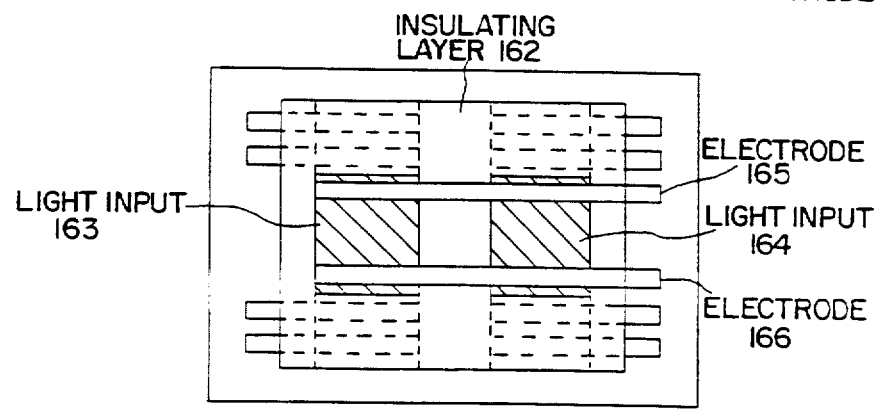
Figure 26C:
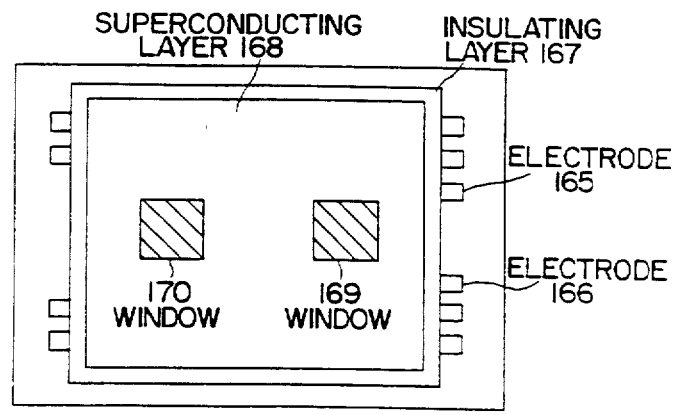
Figure 27A:
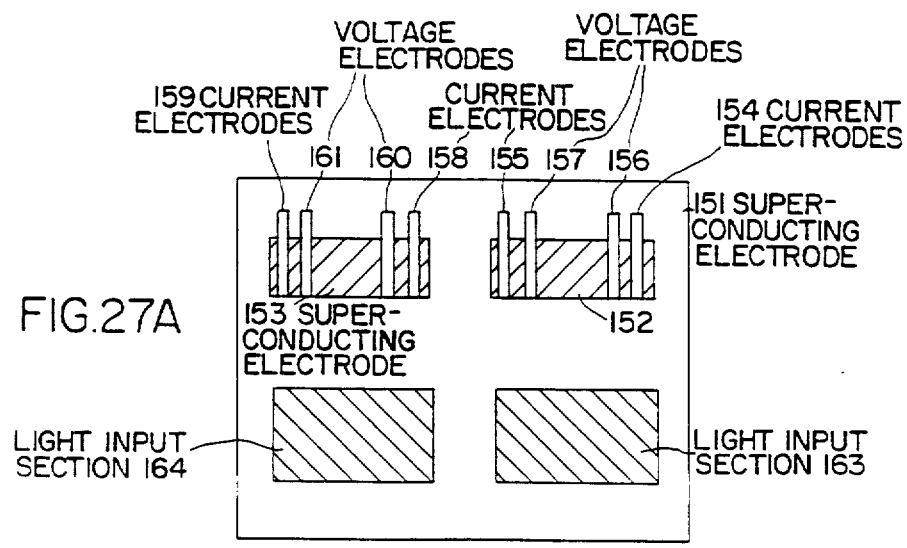
Figure 27B:
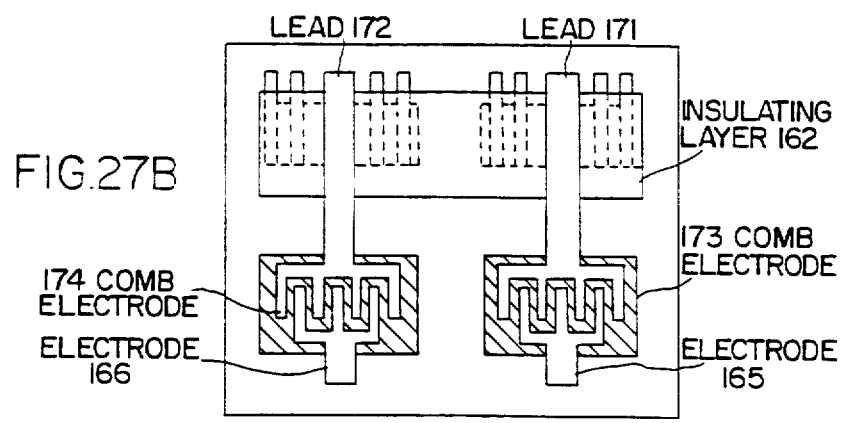
Figure 27C:
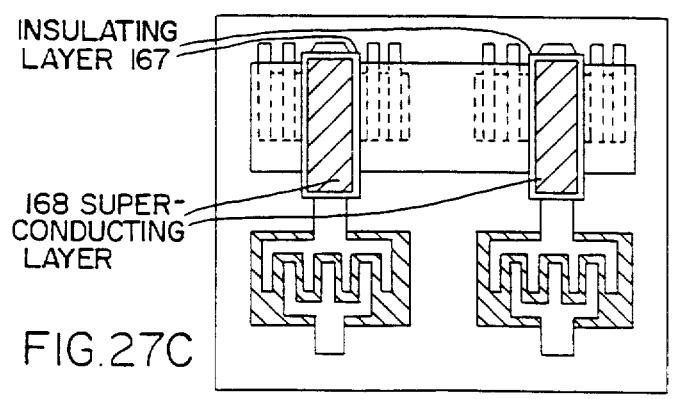
Figure 28A:
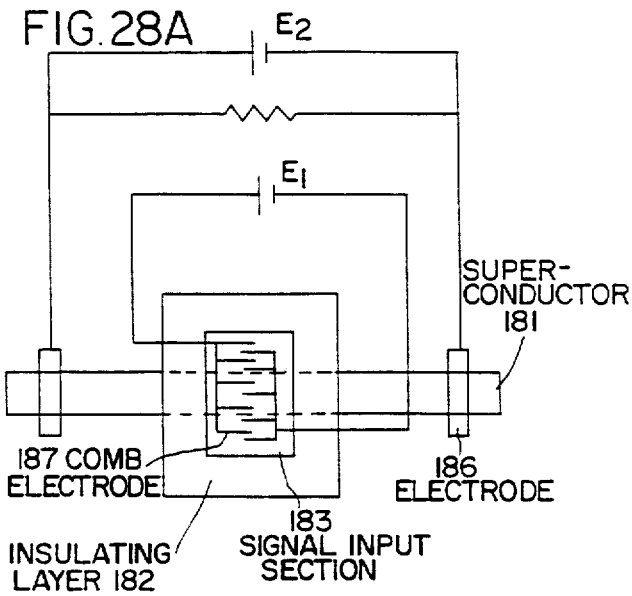
Figure 28B:
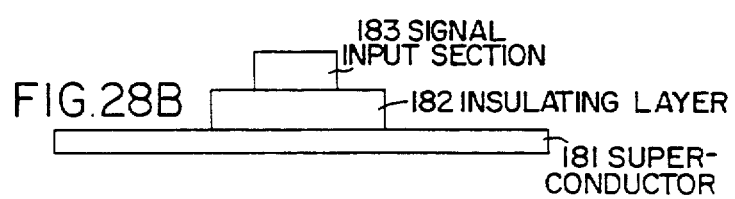
Figure 29:
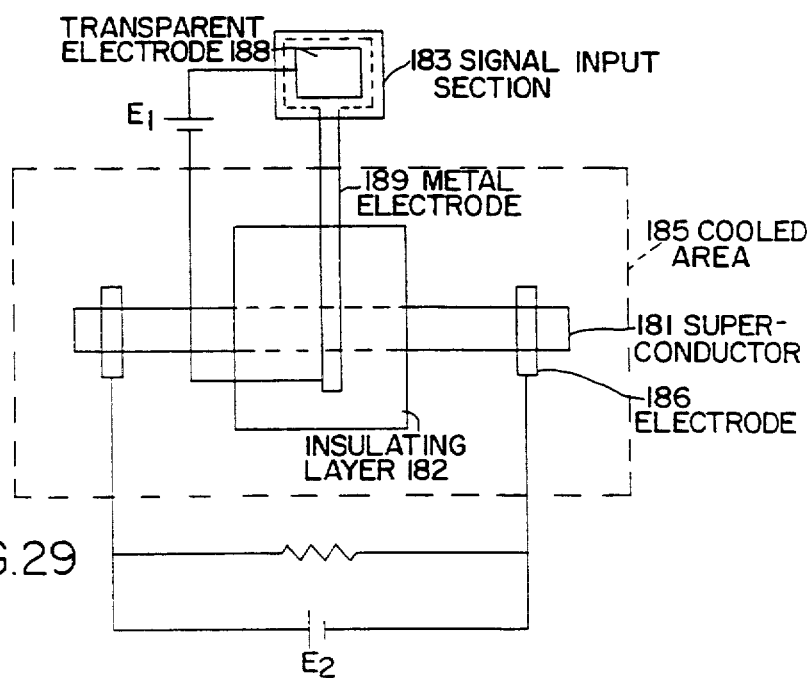
Figure 30:
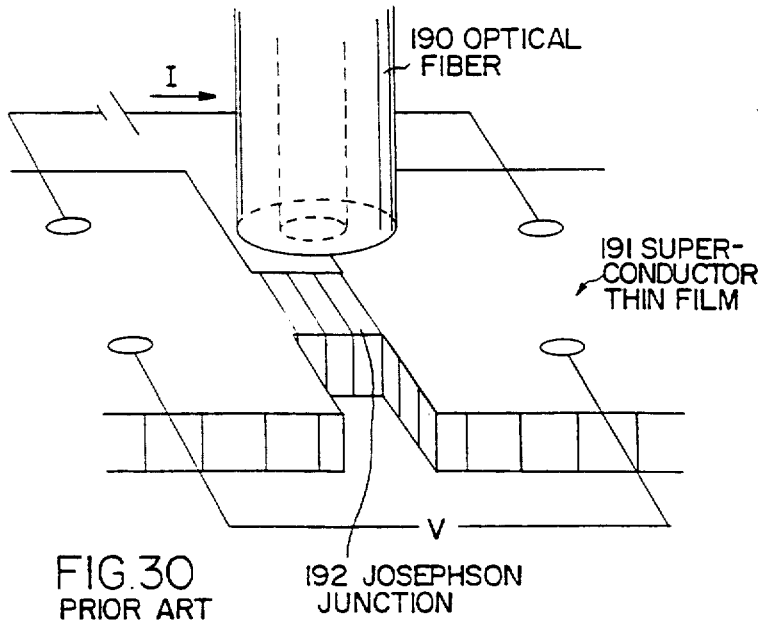
Figure 31:
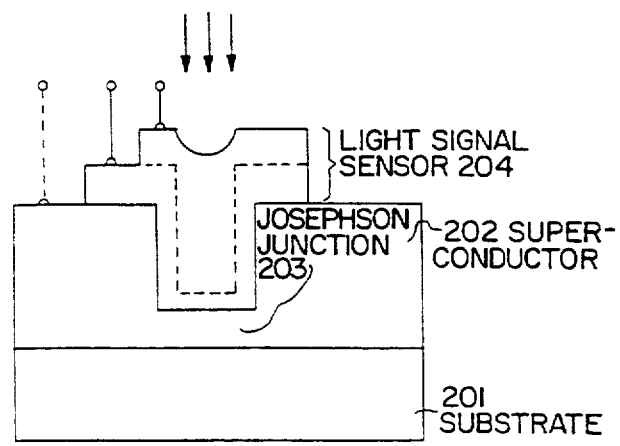

FIGS. 12A and 12B show Example 9 of the present invention.

First, a MgO thin film was deposited to a thickness of 8000 Å on a Si substrate 51 which was not subjected to doping by the magnetron sputtering process to form an insulating layer 67, and a superconducting electrode 52 which served as a signal detecting portion was then formed by depositing Y$_1$Ba$_2$Cu$_3$O$_{7-x}$ ($0 \leq x \leq 0.5$) superconducting thin film to a thickness of 5000 Å on the MgO film 67 by the cluster ion beam deposition process and then by conducting patterning on the superconducting thin film so that the thin film had the same form as that of the superconducting electrode 52 employed in Example 7. Next, voltage detecting electrodes 54, 55, current injecting electrodes 56, 57 and 58 (the electrodes 58 being formed on the electrode 52), and comb electrodes 59 and 60 were formed. The comb electrodes 59 and 60 were formed directly on the photoconductive Si substrate to form a light input portion. Thereafter, MgO insulating layers 61 and 62 were formed on the electrodes 56 and 58, and magnetic field confining superconducting layers 64 and 65 were then formed on the insulating layers 61 and 62 in the same manner as that in Example 8, as shown in FIG. 12B.

The thus-manufactured light detecting device exhibited the same light detection effect as that obtained by Example 8.

EXAMPLE 10

Figure 13:
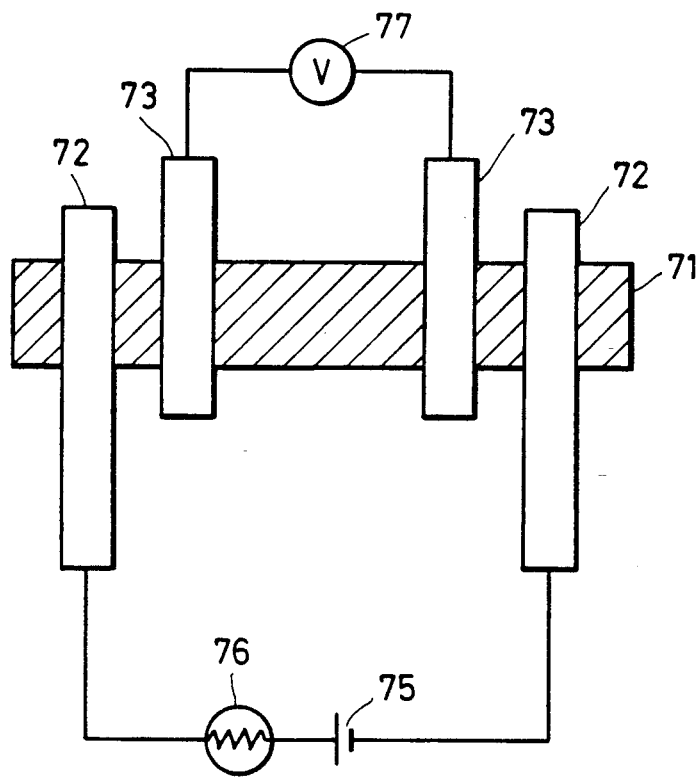

FIG. 13 illustrates the concept of Example 10. In FIG. 13, a reference numeral 71 denotes a superconductor, 72; current injecting electrodes, 73; voltage measuring electrodes, 75; a photoconductive cell driving power source, 76; a photoconductive cell, and 77; a signal detecting voltmeter.

First, an oxide superconductor $YBa_2Cu_3O_{7-\delta}$ ($0 \leq \delta \leq 0.5$) was formed on a MgO substrate (not shown) by the magnetron sputtering technique or the like, and the obtained thin film was then processed by the photolithography technique or the like to form the belt-like superconductor 71. In this Example, the superconductor 71 had a thickness of 5000 Å, a width of 20 μm and a length of 5 mm. Next, four Cr, Au electrodes were formed to a thickness of 1000 Å and in a width of 50 μm on the belt-like superconductor 71 to form the current injecting electrodes 72 and the voltage measuring electrodes 73.

The critical temperature of the superconductor of the thus-arranged detecting device was 88 K. This detecting device was immersed in liquid nitrogen (77 K.), and 10 V was then applied to the photoconductive cell driving power source 75 to apply a bias current of 5 mA. When the photoconductive cell 76 was placed at room temperature and no illumination was conducted on the cell 76, the signal detecting voltmeter 77 pointed 0 V, which means that the superconductor was in a superconducting state. When 5 mW of light was irradiated on the photoconductive cell 76 by means of a He-Ne laser, the signal detecting voltmeter 77 indicated 3 mV. This means that illumination of the photoconductive cell caused a current having a value larger than the critical current value to flow in the superconductor 71, thereby causing the superconductor 71 to undergo transition to a nonsuperconducting state.

EXAMPLE 11

Figure 14:
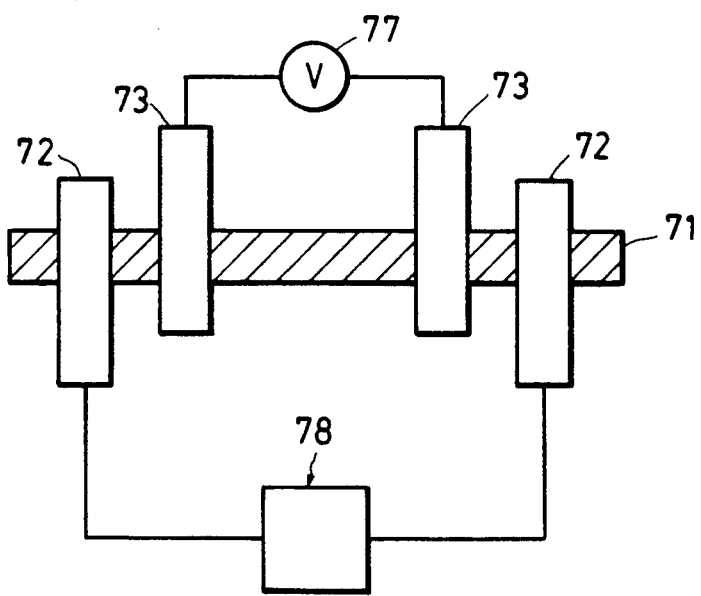

FIG. 14 shows Example 11 of the present invention. The signal input portion of this detecting device employed a PN junction 78 which utilized the photovoltaic effect. When the PN junction 78 was not exposed to light in the liquid nitrogen, no voltage appeared. When the PN junction 78 was illuminated in the same manner as in the case of Example 10, a voltage appeared. This means that the current which flowed in the superconductor 71 increased due to the photovoltaic effect and that the superconductor underwent transition to a nonsuperconducting state.

Light-receiving sensitivity will be improved by providing a small heater in the PN junction, as the photoconductive cell 76 was employed at room temperature in Example 10.

EXAMPLE 12

Figure 15:
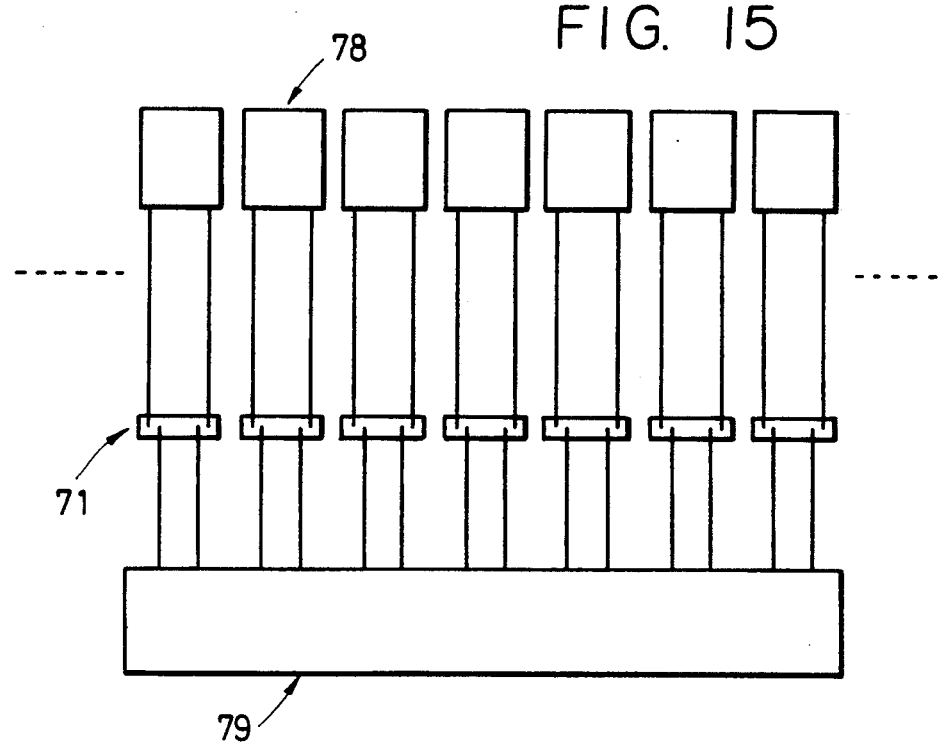

FIG. 15 shows Example 12 in which the light detecting devices shown in FIG. 14 were arranged in an array. Reference numerals 71 denote superconducting thin wires aligned on a straight line. Each of the superconducting thin wires 71 has a thickness of 0.5 μm, a width of 15 μm and a length of 50 μm. A reference numeral 79 denotes a voltage measuring circuit which indicates the voltage of each of the superconducting thin wires. A series of light-receiving portions 78 (PN junctions) are disposed separately from the superconducting wires so that temperature-setting can be separately conducted on the superconducting portions 71 and the light-receiving portions 78. When 10 m lux of light was illuminated on the left half of this array, a voltage appeared on the left half. This means that this array can be used as a line sensor.

EXAMPLE 13

Figure 16:
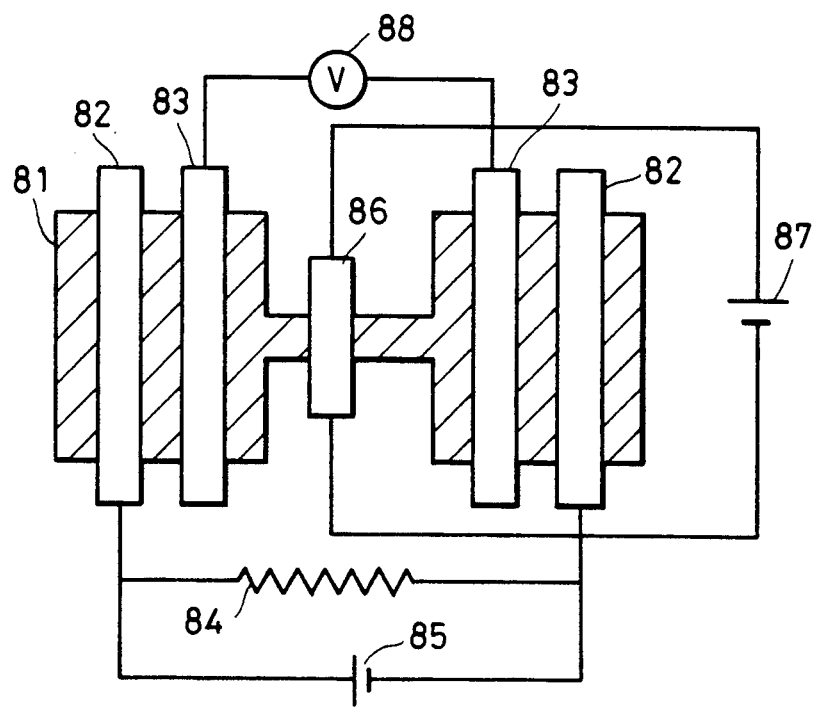

FIG. 16 shows the concept of and manufacture process of Example 13. A reference numeral 81 denotes a superconductor, 82; current injecting electrodes, 83; voltage measuring electrodes, 84; a load resistance, 85; a bias current applying power source, 86; a photoconductor, 87; a photoconductor driving power source, and 88; a signal detecting voltmeter.

First, an oxide superconductor $YBa_2Ca_3O_{7-\delta}$ ($0 \leq \delta \leq 0.5$) was formed on a MgO substrate (not shown) by the magnetron sputtering technique or the like, and the obtained thin film was then processed by the photolithography technique or the like. In this Example, the oxide superconductor had a thickness of 5000 Å, a width of 2 mm and a length of 5 mm, and the microbridge had a width of 8 μm and a length of 12 μm. Next, four Cr, Au electrodes were formed to a thickness of 1000 Å and in a width of 500 μm on the belt-like superconductor 81 to form the current injecting electrodes 82 and the voltage measuring electrodes 83. Subsequently, a MgO insulating thin film was deposited on the central portion of the belt-like superconductor 81, and a CdS film was then deposited on the MgO film to form a signal input portion 86.

The critical temperature of the superconductor of the thus-arranged detecting device was 85 K. This detecting device was immersed in liquid nitrogen (77 K.), 10 mV was applied to the bias current applying power source 85, and 10 V was then applied to the photoconductive cell driving power source 87. When no illumination was conducted on the photoconductor 86, the signal detecting voltmeter 88 pointed 0 V, which means that the superconductor was in a superconducting state. When 5 mW of light was irradiated on the photoconductor 86 by means of a He-Ne laser, the signal detecting voltmeter 88 indicated 3 mV. This means that illumination of the photoconductor 86 caused a light current to flow in the photoconductor 86, causing the magnetic field associated with the light current to restrict the critical current value thereof, and causing the superconductor 86 to undergo transition to a nonsuperconducting state.

EXAMPLE 14

Figure 17:
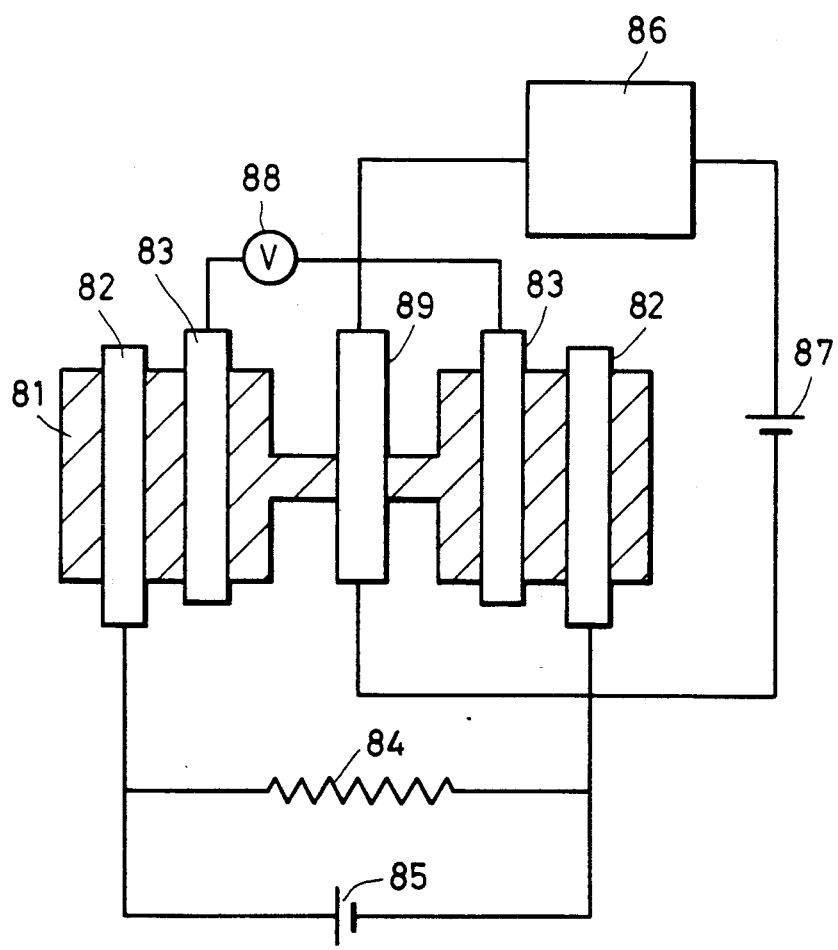

FIG. 17 shows Example 14.

This Example has the same configuration as that of Example 13 with the exception that the signal input portion 86 is separated from the signal detecting portion by providing an electrode 89. Hence, the need for cooling the photoconductor 86 using liquid nitrogen is eliminated. When the same measurement as that conducted in Example 13 was conducted, the same results could be obtained.

EXAMPLE 15

Figure 18:
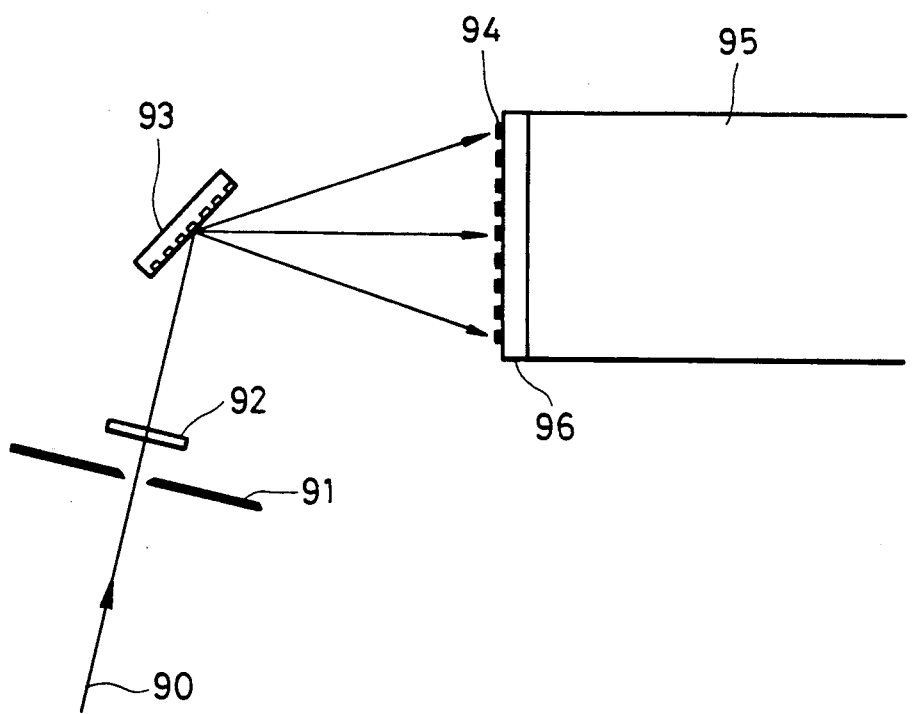
Figure 19:
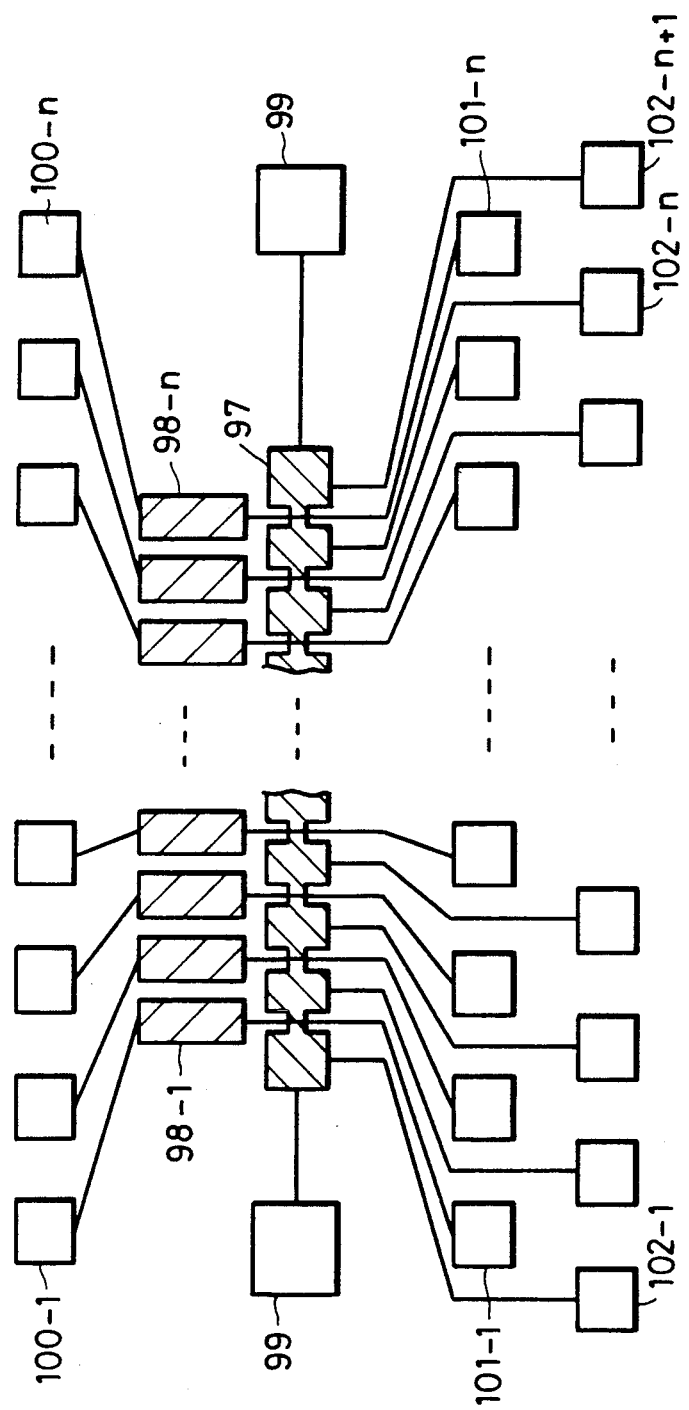

FIG. 18 shows the basic structure of a spectrometer according to the present invention, and FIG. 19 shows the concept of a light detecting array.

In the spectrometer shown in FIG. 18, an incident light 90 passes through a slit 91 and a filter 92 and is made incident onto a diffraction grating or the like (a dispersing element). The light dispersed by the fixed diffraction grating 93 is made incident on a light detection array 94, which consists of light detecting devices each of which employs a Josephson junction provided on a substrate 96 bonded to the surface on a cooling block 95.

In the light detecting array shown in FIG. 19, a reference numeral 97 denotes a superconducting oxide thin film, 98; a photoconductive thin film, 99; a current terminal, 100, 101; a current injecting terminal, and 102; a voltage terminal.

First, a superconducting thin film (made of Bi-Sr-Ca-Cu-O) was formed on a MgO substrate, and the superconductor thin film pattern 97 was then formed by the known process. When necessary, the microbridge portions are covered by an insulating film (made of $SiO_2$). Next, the photoconducting thin film 98 (made of a-Si) was formed. Thereafter, the electrodes (made of Cr-Au) was deposited, and wiring, the current terminals 99, the current injecting terminals 100, 101, and the voltage terminals 102 were then manufactured. Connection of external leads were conducted.

The portion of the spectrometer shown in FIG. 18 which surrounded the cooling block 95 was placed in an evacuated Dewar vessel so as to maintain the temperature thereof to a fixed value. The light detecting devices were operated at a temperature near 77 K.

EXAMPLE 16

Figure 20:
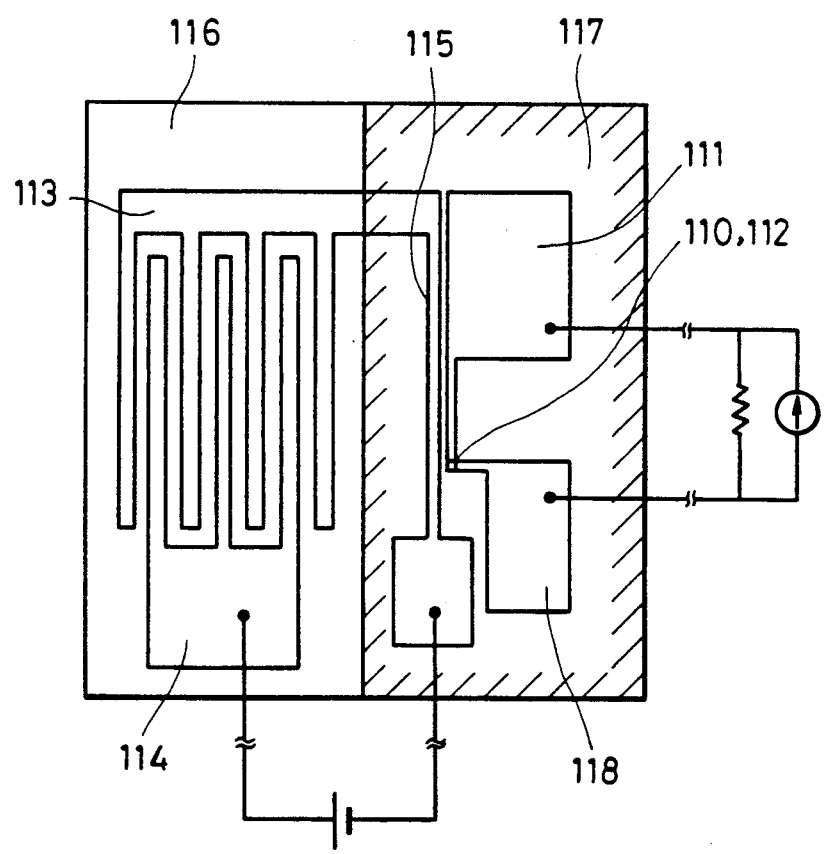

FIG. 20 shows Example 16 which employs the signal input portion made of Si and a Nb/Al-AlOx/Nb SIS device.

First, an insulating film 117 ($SiO_2$) was formed to a thickness of 1000 Å on half of a non-doped Si wafer substrate (100 plane) 116, and a lower electrode 118 (Nb) an insulating layer 110 (Al-AlOx), and an upper electrode 111 (Nb) were then formed on the insulating film 117 by the known technique to form an SIS device 112 having a junction areas of 5 $\mu m \times 5$ $\mu m$. Next, the portion of the Si wafer 116 which was not covered by the insulating film 117 was processed using hydrofluoric acid, and comb electrodes 113 and 114 (Cr/Au) were then formed to a thickness of 1500 Å using a metal mask, as shown in FIG. 20. The length of the comb electrodes was 4 mm, the distance between the adjacent electrodes was 0.1 mm, and the light-receiving area of the comb electrodes was 0.05 $cm^2$. In this way, ohmic contact was achieved between the Si and the Cr/Au. A current path 115 was separated from the SIS device 112 by a distance of 10 $\mu m$. When light response of the thus-manufactured light detecting device was estimated, switching of the SIS device (0 mV to 2.8 mV) could be confirmed at a temperature of 4 K. and with the bias current of 1.2 mA, 0.1 mW of illumination by means of a He-Ne laser (with a wavelength of 633 nm), and comb electrode applied voltage of 10 V.

EXAMPLE 17

Figure 21:
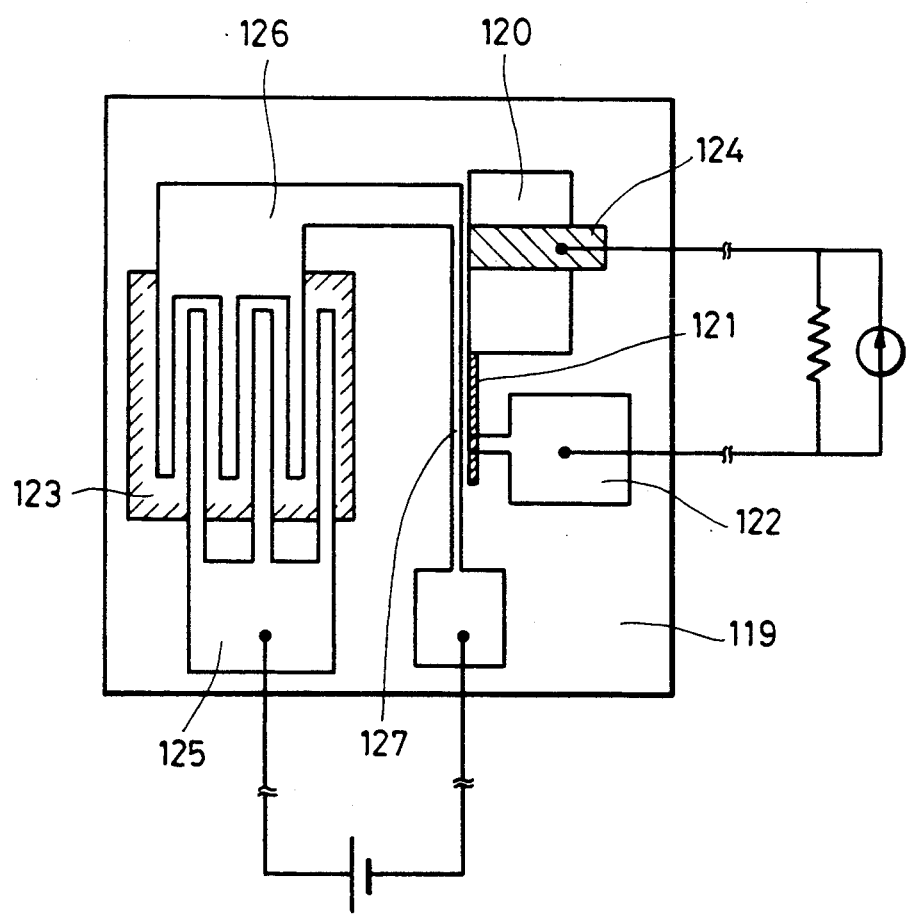

FIG. 21 shows Example 17 which employs amorphous Si in the signal input portion and a Y-Ba-Cu-O/silver oxide/Pb SIS device.

First, a lower electrode 120 was formed by depositing Y-Ba-Cu-O oxide superconductor to a thickness of 5000 Å on a MgO substrate (100 plane) 119 in argon and oxygen by means of the RF magnetron sputtering technique while maintaining the temperature of the substrate 119 to 550° C., and an insulating layer ($Ag/Ag_2O$) 121 was then formed to a thickness of 100 Å in argon and in vacuum while maintaining the temperature of the substrate 119 to 100° C. Next, Ag was oxidized by introducing oxygen while heating to a temperature of 400° C. Thereafter, a bridge pattern (121 in FIG. 21) having a width of 10 $\mu m$ was formed by the photolithography process. Next, an upper electrode 122 (Pb) was deposited to a thickness of 500 Å using a metal mask. The portion of the upper electrode 122 which was laid on the bridge pattern had a width of 100 $\mu m$ and a junction area of 100 $\mu m \times 10$ $\mu m$. The effective area was an order of magnitude less due to non-uniformity of the Ag oxide film. Next, amorphous Si 123 was deposited to a thickness of 2000 Å in an area of 2 mm×2 mm by the CVD process to form a signal input portion, and comb electrodes 125 and 126 (Cr/Au) were finally formed to a thickness of 500 Å. A current path 127 was separated from the SIS device by a distance of 10 $\mu m$. When light response of the light detecting device manufactured in the manner described above was estimated, switching (0 mV to 20 mV) of the SIS device could be confirmed at a temperature of 4 K. and with a bias current of 0.85 mA, 0.1 mW of illumination by means of a He-Ne laser (with a wavelength of 633 nm), and a comb electrode applied voltage of 10 V.

EXAMPLE 18

The detecting device of Example 18 was manufactured in the same manner as Example 17 with the exception that a PN junction was formed by forming N type amorphous Si to a thickness of 1500 Å and then by forming P type amorphous Si to a thickness of 1500 Å on the N type amorphous Si, and that the comb electrodes 126 and 127 were short-circuited. When a bias current of 0.88 mA was applied to this device at a temperature of 4 K. and 2 mW of light was irradiated on the device by means of a He-Ne laser (with a wavelength of 633 nm), switching (0 mV to 20 mV) of the SIS device could be confirmed.

EXAMPLE 19

Figure 22:
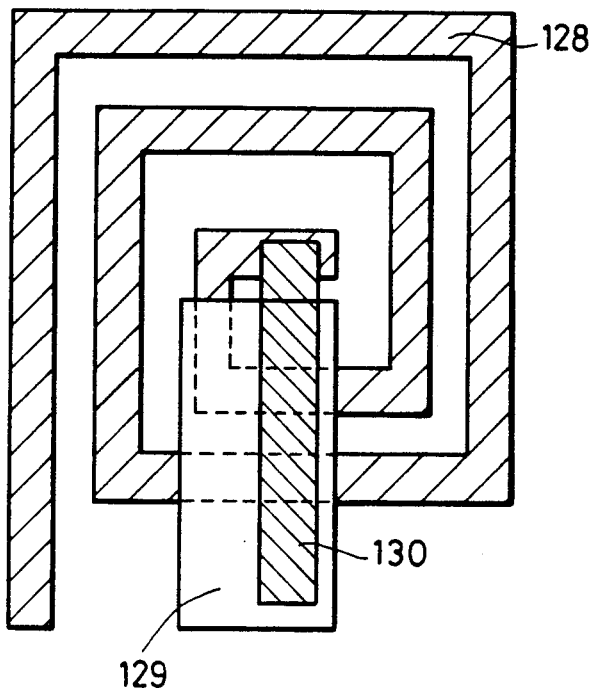

A light detecting device of Example 19 has the same configuration as that of Example 17 with the exception that the signal input portion 123 was a CdS thin film, that the comb electrode 126 was formed of YBaCuO type superconductor, and that the current path 127 was formed into a coil. FIG. 22 shows such a coil-like form (in FIG. 22, a reference numeral 128 denotes a lower coil-shaped electrode, 130; an upper coil-shaped electrode, and 129; an insulating film. The bridge portion was disposed above or below the center of the coils. In this structure, since the resistance of the electrode wiring is 0 and since the magnitude of a magnetic field generated by the coil-shaped current path increases, switching sensitivity of the SIS device can be greatly improved.

EXAMPLE 20

Figure 23:
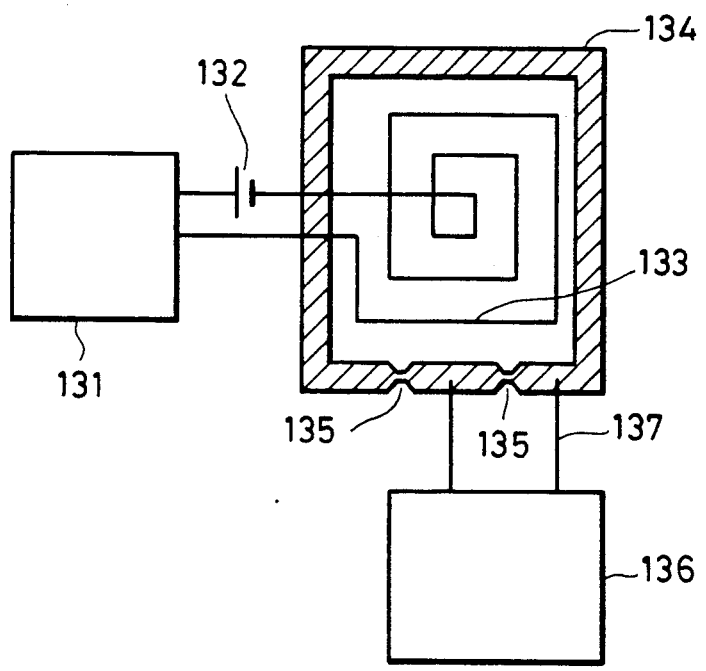

FIG. 23 shows the concept of Example 20 of the present invention. In FIG. 23, a reference numeral 131 denotes a signal input portion, 132; a current driving power source, 133; magnetic field generating wiring, 134; a superconducting ring, 135; weak link portions, and 136; a DC SQUID detecting and a feed back circuit.

First, an oxide superconductor $YBa_2Cu_3O_{7-\delta}$ ($0 \leq \delta \leq 0.5$) was formed on a MgO substrate (not shown) by the magnetron sputtering technique or the like, and the obtained thin film was then processed by the photolithography technique or the like. In this Example, the oxide superconductor was deposited to a thickness of 5000 Å. In the superconducting ring 134, the ring portion had a width of 20 μm, and each of the weak link portions 135 had a width of 4 μm. Next, Cr, Au were deposited to form electrodes 137 which connect the superconducting ring 134 to the detecting circuit 136. MgO was deposited to a thickness of 3000 Å on the superconducting ring 134, and the magnetic field generating wiring 133 made of Al was then formed on the MgO, as shown in FIG. 23. The signal input portion 131 employed a photo diode, and was heated to 250 K. by a heater.

Measurement was conducted on the thus-manufactured light detecting device in a quiet environment while the temperature thereof was maintained to 15 K. When no light irradiated the signal input portion in a state where 10 V was being applied to the power source 32, the voltage appeared in the SQUID detecting portion remained the same. When 1 m lux of light was illuminated on the light receiving portion, a change in the voltage occurred in the detecting portion. This means that the superconducting ring was invaded by a magnetic field.

EXAMPLE 21

Figure 24:
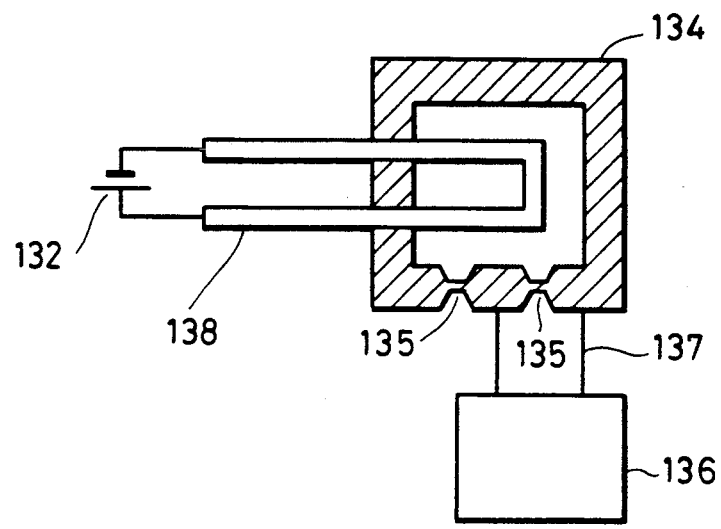

FIG. 24 shows Example 21 in which a magnetic field generating coil functions as a light-receiving portion. A photoconductor 138 is electrically insulated from a superconductor by means of a MgO thin film. When 40 V was applied to the power source 132 in a dark state while the temperature of the detecting device was maintained to 20 K., a dark current was detected by the SQUID but the voltage fell to a fixed value. When 10 m lux of light was illuminated on the photoconductor 138, a signal was detected by the SQUID in response to the illumination. This means that a current having a magnitude larger than the dark current flowed in the photoconductor when it was illuminated, and that that current was converted into a magnetic field.

EXAMPLE 22

Figure 25:
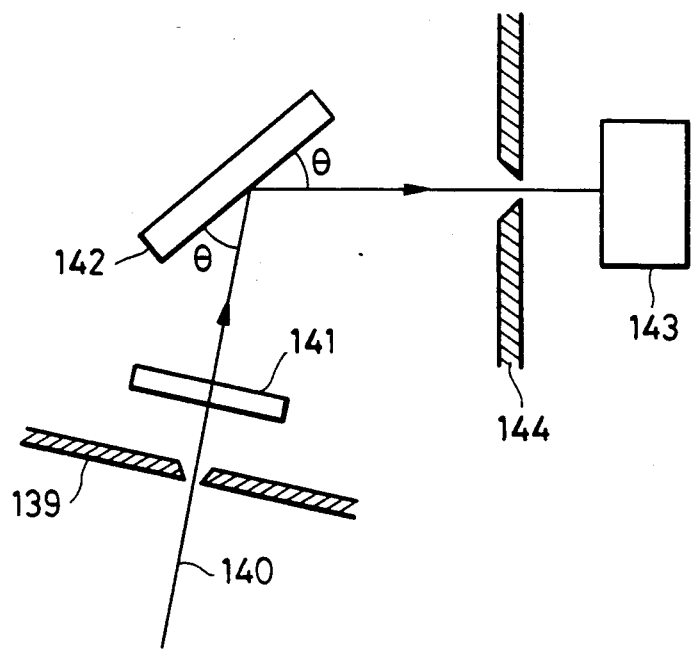

FIG. 25 shows a spectroscope which employs a light detecting device according to the present invention. In FIG. 25, reference numerals 139 and 144 denote slits, 140; an incident light, 141; a filter, 142; a diffraction grating, and 143; a light detecting device.

In this spectroscope, the incident light 140 is narrowed by the slit 139, and only a particular wavelength range of the narrowed light is passed thorugh the filter 141. The light incident on the diffraction grating 142 is dispersed at different angles determined by the wavelengths. Hence, the wavelength of the light which passes through the slit 144 can be changed by changing the angle $\theta$ between the surface of the diffraction grating and the optical axis. The light whose spectrum is obtained by the passing through the slit 144 is made incident on and detected by the light detecting device 143 according to the present invention. The light detecting device employed SQUID according to the present invention is particularly effective for use in a spectroscope of the type which detects a specially weak light.

EXAMPLE 23

FIG. 26 shows the concept and manufacture process of Example 23 of the present invention.

Figure 26A:
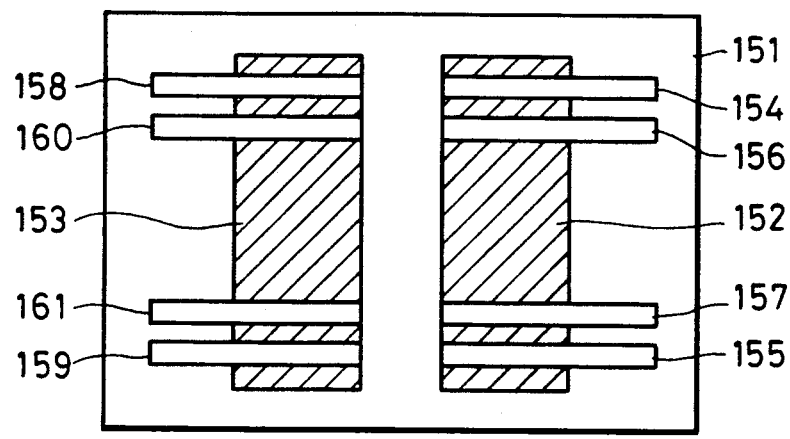
Figure 26B:
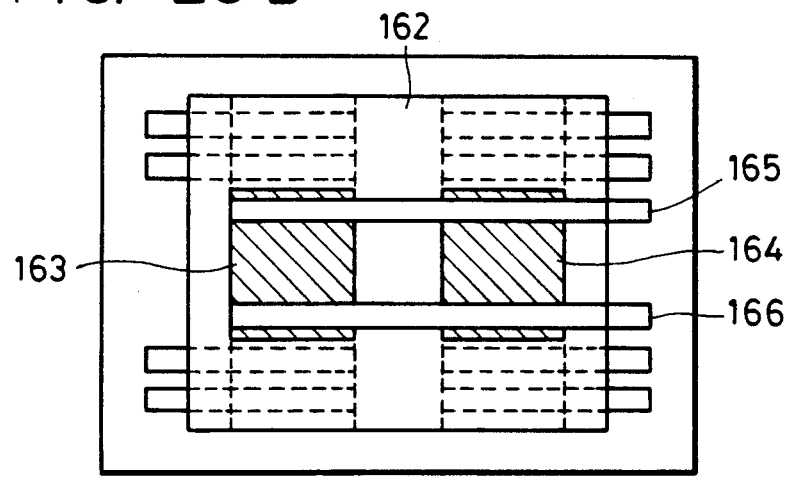
Figure 26C:
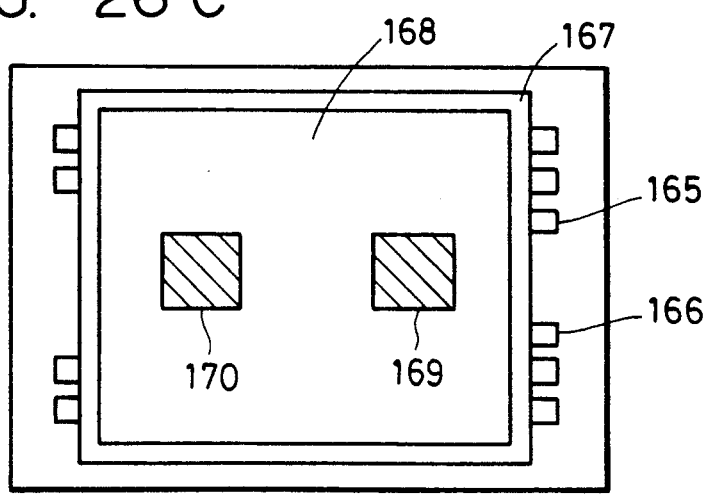

First, a $Y_1Ba_2Cu_3O_{7-x}$ ($0 \leq x \leq 0.5$) thin film was deposited to a thickness of 8000 Å on a MgO single crystal substrate 151 by the cluster ion beam deposition technique, and the obtained thin film was then processed by the photolithographic technique such that the thin film had a width of 10 μm and a length of 2 mm to form superconducting electrodes 152 and 153 which acted as the magnetic field detecting portion, as shown in FIG. 26(a). The electrodes 152 and 153 were separated from each other by a distance of 5 μm. Next, a Pt thin film was deposited by the ion beam sputtering technique to form current electrodes 154, 155 and 158, 159, and voltage electrodes 156, 157 and 160, 161 on the superconducting electrodes 152 and 153. Next, a MgO thin film was deposited to a thickness of 1 μm by the magnetron sputtering technique to form an insulating layer 162. Thereafter, a CdS thin film was deposited on the MgO thin film, and the deposited CdS thin film was then subjected to the photolithography such that it had a width of 10 μm and a length of 1.0 mm which enabled it to be overlaid on the superconducting electrodes 152 and 153 to form light input portions 163 and 164, as shown in FIG. 26(b). Thereafter, Pt electrodes 165 and 166 were formed on the light input portions 163 and 164. Next, a MgO thin film was deposited to a thickness of 1 μm in the same manner as that in which the insulating layer 162 was formed to form an insulating layer 167, and a $Y_1Ba_2Cu_3O_{7-x}$ ($0 \leq x \leq 0.5$) thin film was then deposited in the same manner as that in which the superconducting electrodes 152 and 153 were formed to form a magnetic field confining superconducting layer 168, as shown in FIG. 26(c). Finally, windows 169 and 170, each of which had a width of 10 μm and a length of 800 μm, were formed by the photolithography process so as to allow part of the light input portions 163 and 164 to be exposed.

In the thus-arranged detecting device, the superconducting electrodes 152 and 153 and the magnetic field confining superconducting layer 168 were in a superconducting state at a temperature lower than 82 K. When an Ar+ laser beam (with a wavelength of 514.5 mm, at an output of 1.0 V) was irradiated on the windows 169 and 170 while 1.0 V of constant voltage was being applied between the electrodes 165 and 166 and while the detecting device was being immersed in liquid nitrogen and thereby cooled to 77 K., the critical current value Ic of the superconducting electrodes 152 and 153 decreased from 0.5 mA to 0.4 mA. When the laser beam was illuminated only on the window 169, the critical current value Ic of only the superconducting electrode 152 decreased. This proves that an effective light detection can be conducted in Example 23.

EXAMPLE 24

FIG. 27 shows Example 24 of the present invention. In this example, a light input portion is separated from a magnetic field detecting portion, and a current generated in the light input portion is introduced to the vicinity of the magnetic field detecting portion through the wiring so as to allow the magnetic field generated in the light detecting portion to be detected.

Figure 27A:
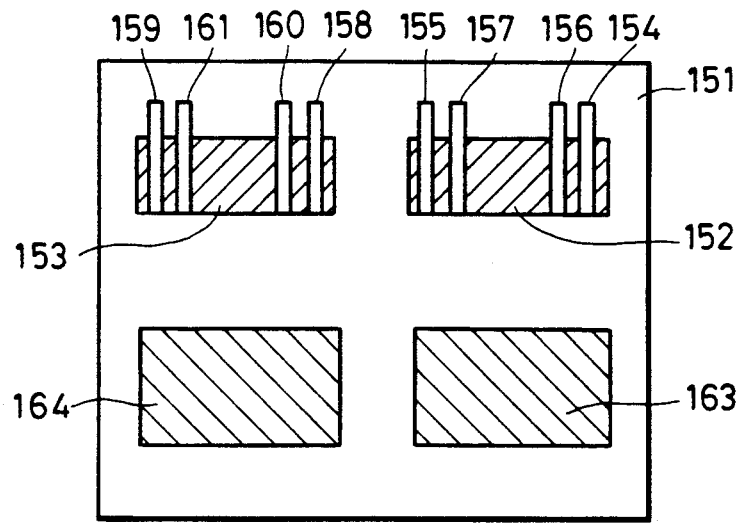

First, $Bi_2Sr_2Ca_2Cu_3O_x$ oxide superconducting thin film was deposited to a thickness of 5000 Å on a MgO substrate 151 by the magnetron sputtering technique, and the thus-formed thin film was subjected to the photolithographic process to form magnetic field detecting superconducting electrodes 152 and 153 having a width of 10 μm and a length of 50 μm, as shown in FIG. 27(a). Thereafter, current electrodes 154, 155 and 158, 159 and voltage electrodes 156, 157 and 160, 161 were formed by resistance heating Pt. Next, a-Si was deposited at a site separated from the electrodes by a distance of 10 mm to form light input portions 163 and 164.

Figure 27B:
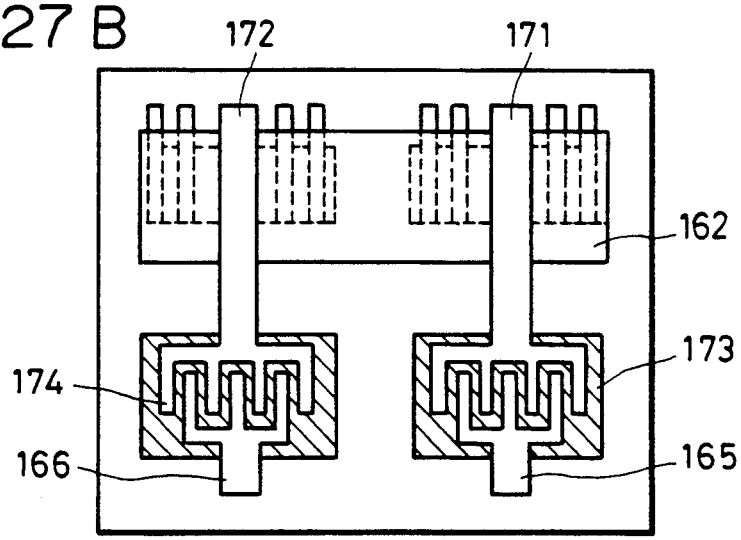
Figure 27C:
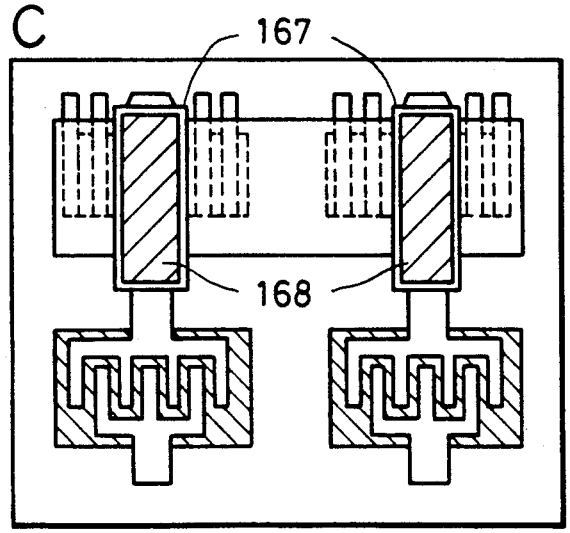
Figure 28A:
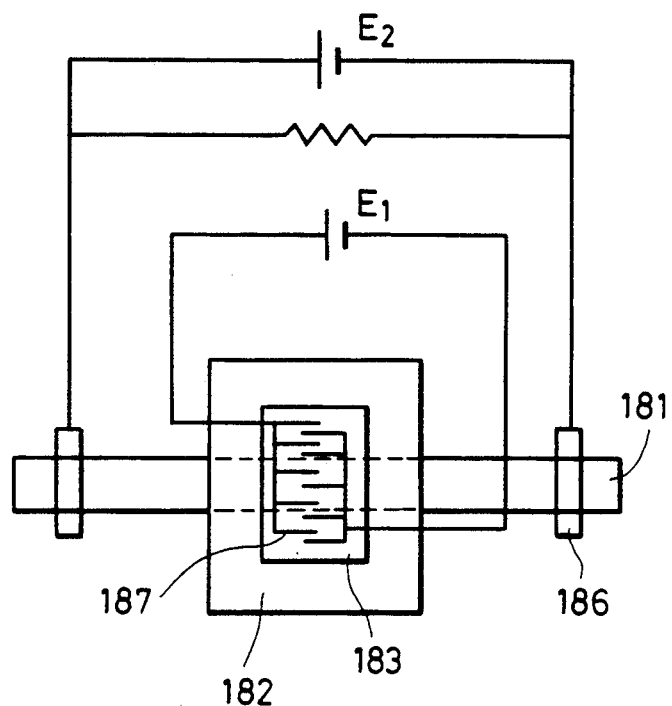
Figure 28B:
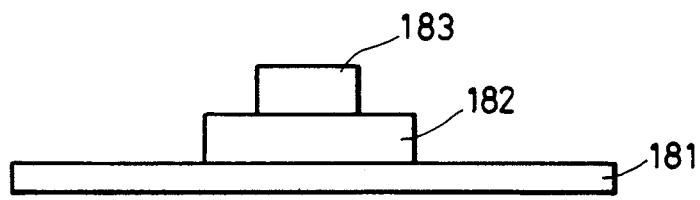

Next, a MgO insulating layer 162 is deposited on the magnetic detecting portion, and electrodes 165 and 166, leads 171 and 172, and comb electrodes 173 and 174 were then formed, as shown in FIG. 27(b). Thereafter, a MgO insulating layer 167 was formed on the leads 171 and 172, and a magnetic field confining superconducting layer 168 was then formed, as shown in FIG. 27(c).

The thus-arranged light detecting device was capable of detecting light at a temperature of 77 K., like Example 23.

In Example 24, since cooling of only the magnetic field detecting portion is necessary, the size of a cooling device can be made small. Furthermore, since the light input portion and the magnetic field detecting portion can be operated at different optimum temperatures, the characteristics of the device can be improved.

EXAMPLE 25

FIG. 28 shows the concept of Example 25. In FIG. 28, a reference numeral 181 denotes a superconductor, 182; an insulating layer for electrically insulating the superconductor from a conductor, and 183; a signal input portion (a light receiving portion).

First, a $Y_1Ba_2Cu_3O_7$-δ ($0 \leq \delta \leq 0.5$) thin film was deposited on a MgO substrate (not shown) by the magnetron sputtering technique, and the obtained thin film was then processed by the photolithography technique such that the thin film had a thickness of 5000 Å, a width of 10 μm and a length of 10 mm to form a belt-shaped superconductor 181. Next, a MgO thin film was deposited to a thickness of 2000 Å and in an area of 4×4 mm² on the central portion of the belt-shaped superconductor 181 to form an insulating layer 182. Finally, a CdS film was deposited to a thickness of 3000 Å and in an area of 3×3 mm² on the insulating layer 182 to form a signal input portion 183.

In this example, the oxide superconductor 181 has a critical temperature of 82 K., i.e., the resistance of the oxide superconductor 181 is zero at a temperature of 82 K. or below. This detecting device was immersed in liquid nitrogen and thereby cooled (to 77 K.), and an Ar+ laser beam with a wavelength of 514.5 mm (at an output of 5 mW) was irradiated on the signal input portion 183 made of a CdS film. When 10 V was applied to the comb electrode 187 formed on the CdS film, the current which flowed in the superconductor 181 varied in accordance with ON-OFF of the laser beam, i.e., the current value decreased by 10% when the laser beam was irradiated as compared with that obtained when no laser beam was illuminated. This means that irradiation of the Ar+ laser beam generated a light current in the CdS film, and that the superconductor 181 detected a magnetic field generated by this light current.

EXAMPLE 26

Figure 29:
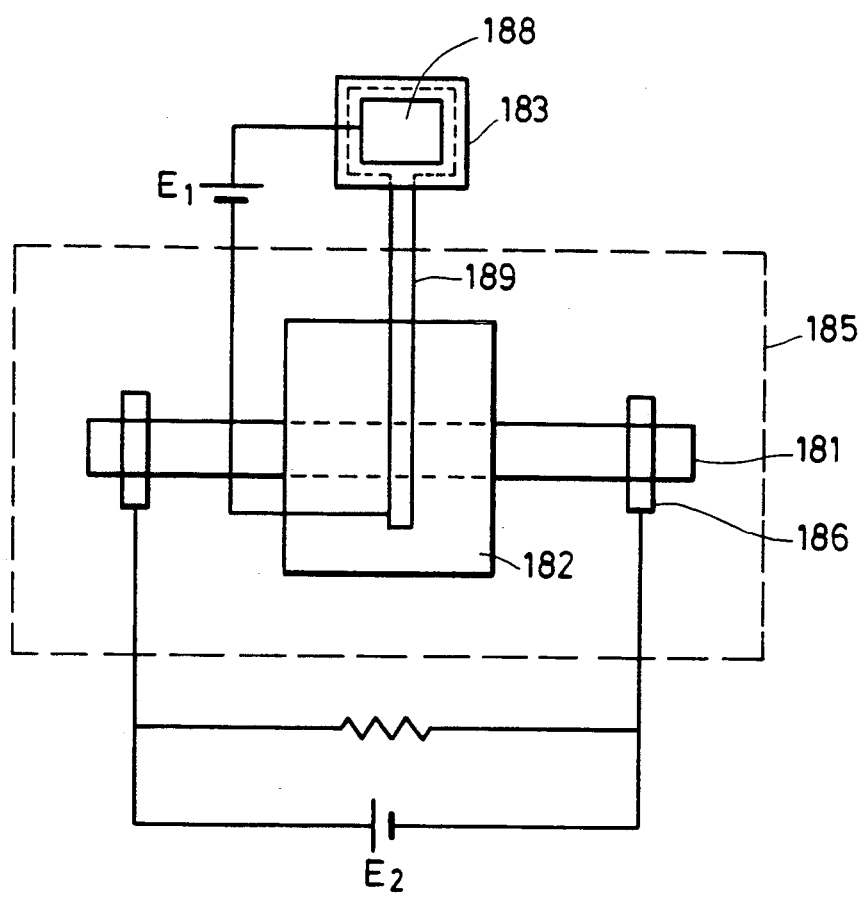
Figure 30:
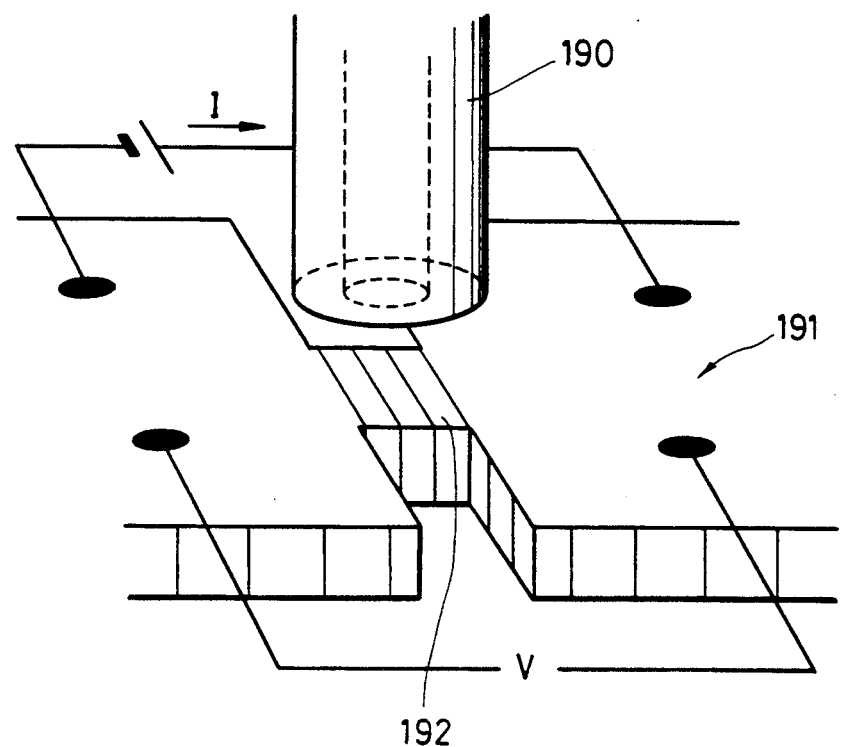
FIGS. 30 and 31 are schematic views showing the conventional detecting devices.
Figure 31:
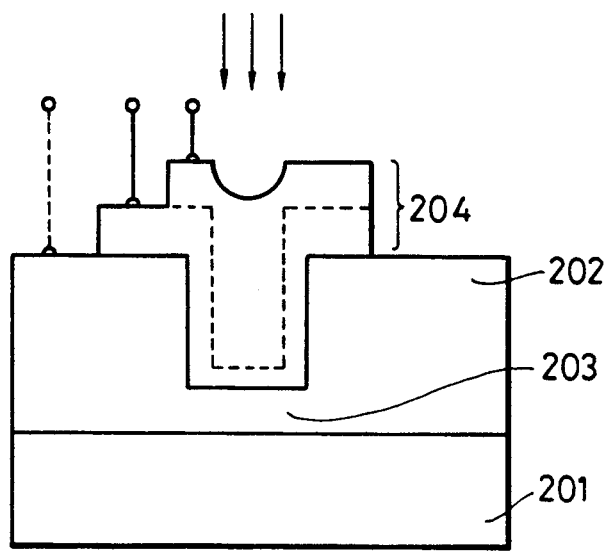
Figure 1:
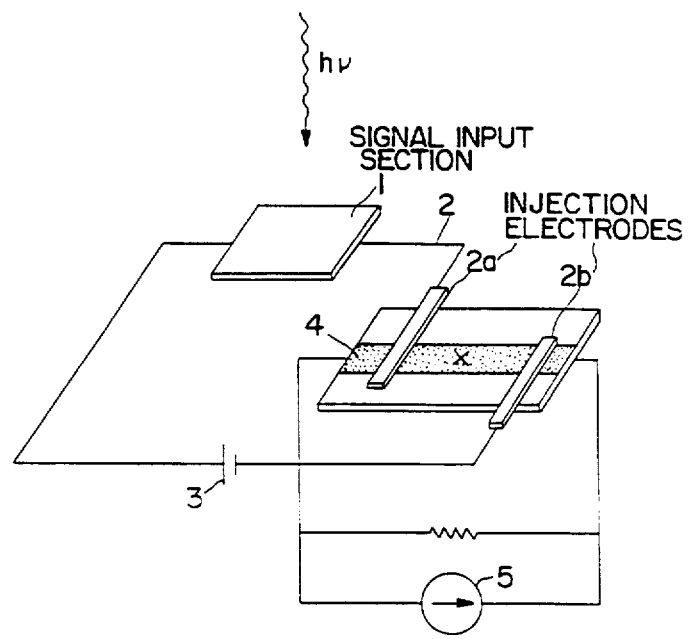
Figure 2:
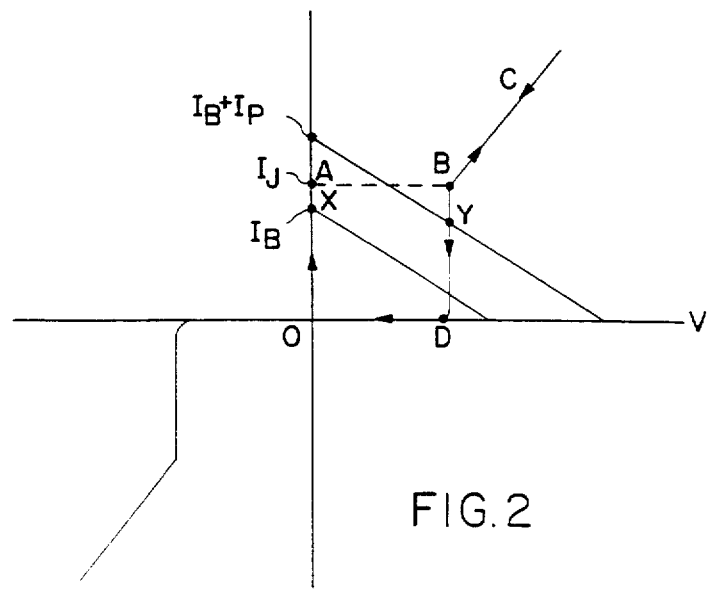
Figure 3:
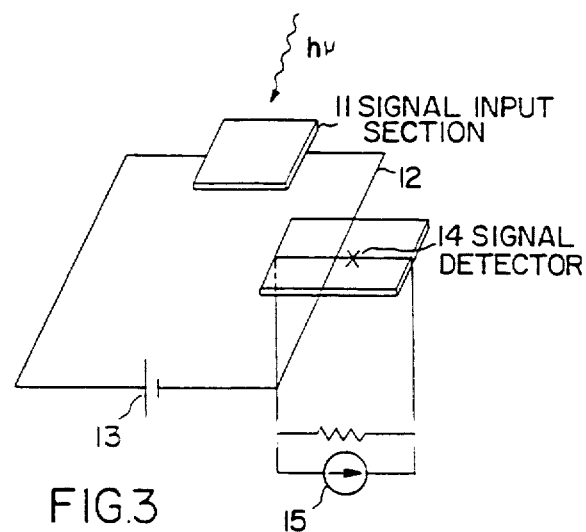
Figure 4:
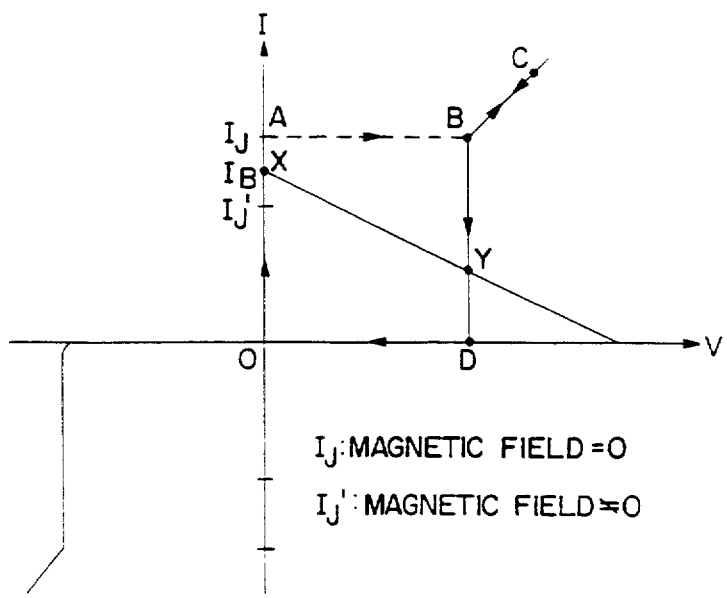
Figure 5:
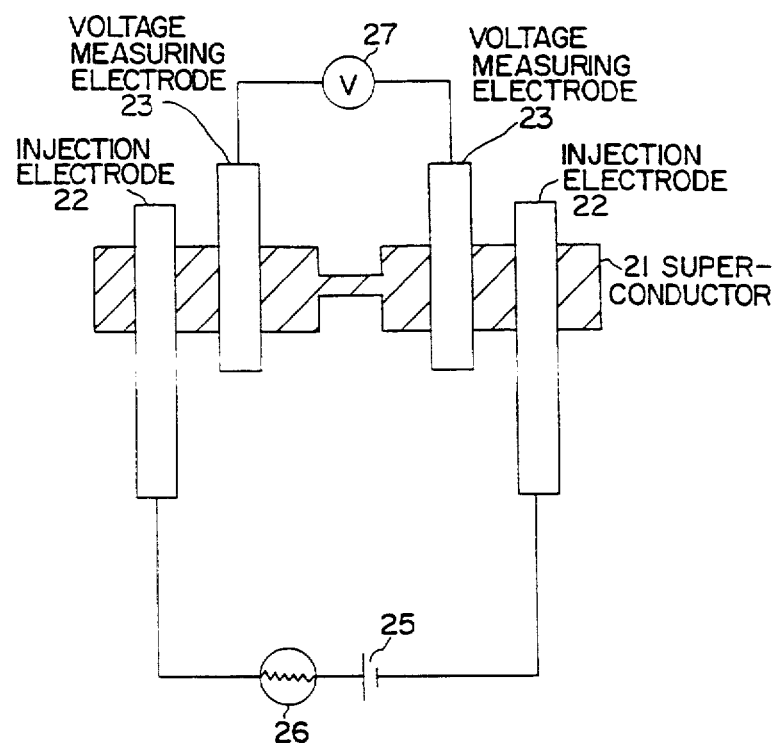
Figure 6:
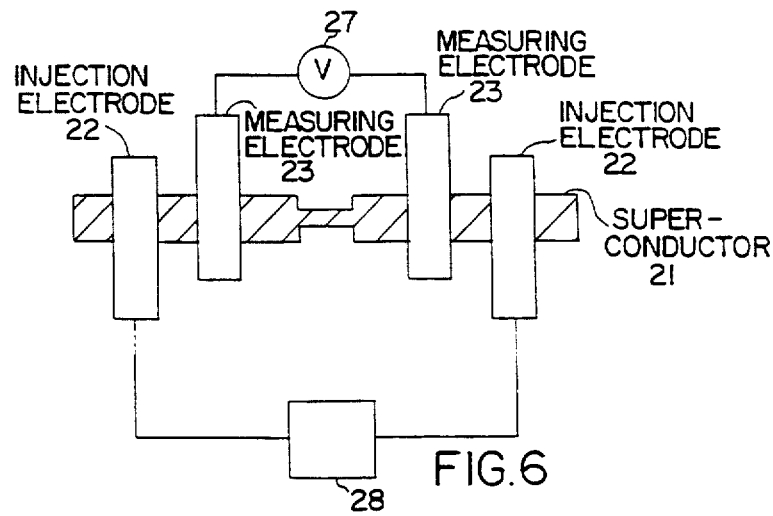
Figure 7:
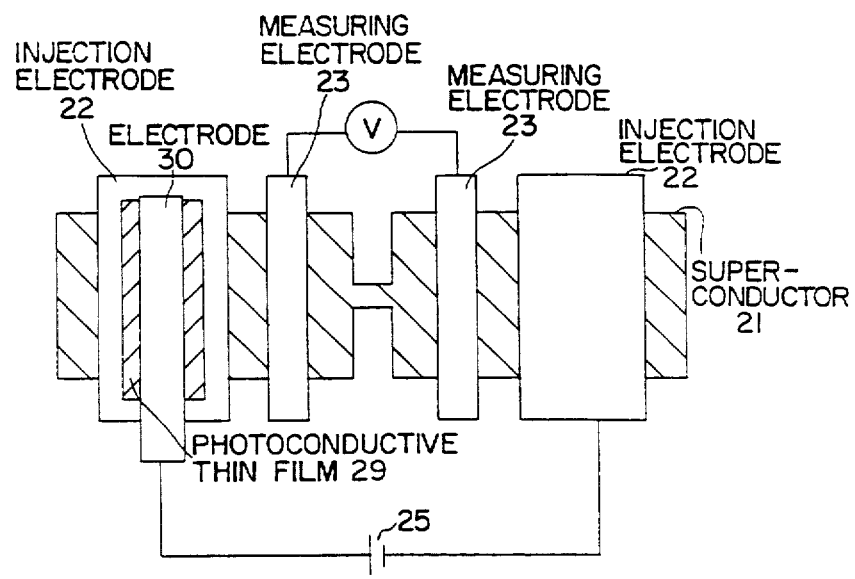
Figure 8:
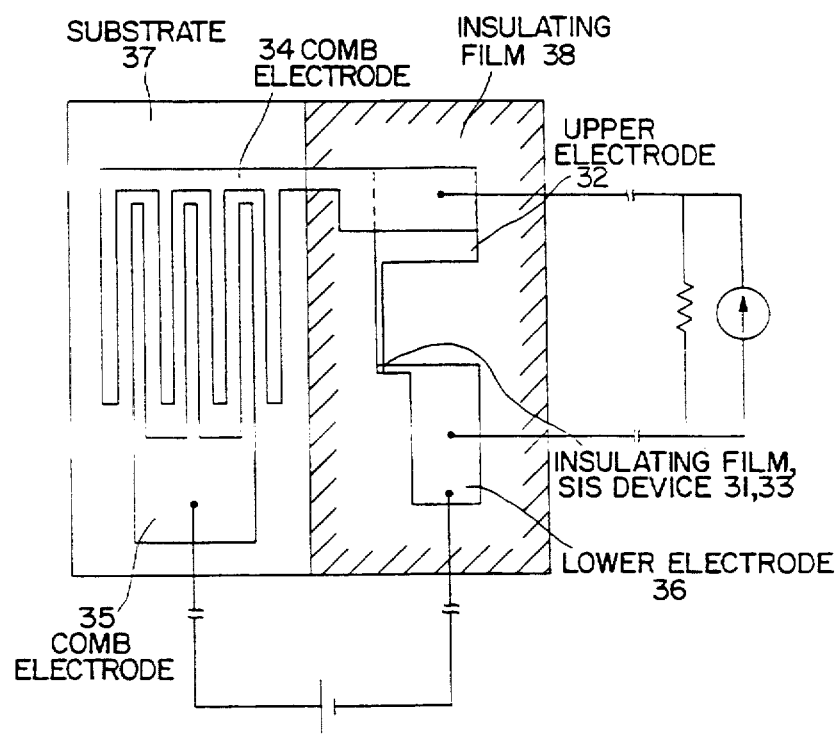
Figure 9:
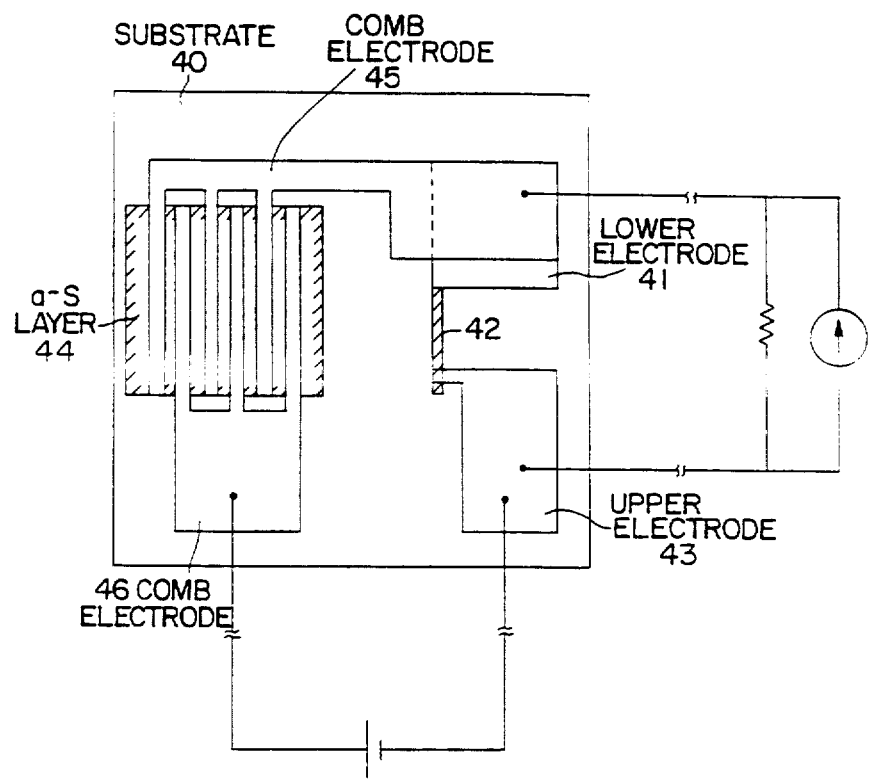

FIG. 29 shows Example 26 of the present invention. In this detecting device, the signal receiving portion (the signal input portion) is separated from the signal detecting portion. In the detecting device shown in FIG. 29, since control of the temperature of only an area 185 is necessary, the area 185 was cooled to 77 K. using a cryostat.

In a case where the same materials as those used in Example 25 were employed, illumination of a laser beam reduced the current which flowed in the superconductor by 10 to 20%. In Example 26, a transparent electrode 188 was formed on the signal receiving portion, and a metal electrode 189 was formed below the signal receiving portion.

What is claimed is:

1. A light detecting device comprising:
   a signal input portion which generates a current upon input of a light signal;
   a signal detecting portion including a superconductor which detects the light signal with injection of the generated current; and
   electrodes through which the generated current is injected into said superconductor.

2. A light detecting device according to claim 1, wherein said signal detecting portion includes a microbridge type Josephson junction.

3. A light detecting device according to claim 1, wherein said signal detecting portion includes a superconductor-insulator-superconductor Josephson junction.

4. A light detecting device according to claim 1, wherein said signal input portion is made of a selected one of photoconducting material and a material which generates a photoelectromotive force.

5. A light detecting device according to claim 1, further comprising a magnetic field confining superconductor for confining a magnetic field created by the generated current due to the Meissner effect.

6. A light detecting device according to claim 1, further comprising a cooler for cooling at least the signal detecting portion.

7. A light detecting device according to claim 6, wherein said signal detecting portion is disposed within said cooler while said signal input portion is disposed outside of said cooler.

8. A light detecting device comprising:
   a signal input portion which generates a current upon input of a light signal; and
   a signal detecting portion including a superconductor which detects a magnetic field created by the current.

9. A light detecting device according to claim 8, wherein said signal detecting portion includes a microbridge type Josephson junction.

10. A light detecting device according to claim 8, wherein said signal detecting portion includes a superconductor-insulator-superconductor Josephson junction.

11. A light detecting device according to claim 8, wherein said signal detecting portion includes a superconducting quantum interferometric device.

12. A light detecting device according to claim 8, wherein said signal input portion is made of a selected one of photoconducting material and a material which generates a photoelectromotive force.

13. A light detecting device according to claim 8, further comprising a magnetic field creating means for creating a magnetic field associated with the generated current.

14. A light detecting device according to claim 8, further comprising a magnetic field confining superconductor for confining a magnetic field created by the generated current due to the Meissner effect.

15. A light detecting device according to claim 8, further comprising a cooler for cooling at least said signal detecting portion.

16. A light detecting device according to claim 15, wherein said signal detecting portion is disposed within said cooler while said signal input portion is disposed outside of said cooler.

17. A photoelectric conversion device comprising:
a signal input portion which generates a current upon input of a light signal;
a signal detecting portion including a superconductor which detects the light signal as an electric signal with injection of the generated current; and
electrodes through which the generated current is injected into said superconductor.

18. A photoelectric conversion device comprising:
a signal input portion which generates a current upon input of a light signal; and
a signal detecting portion including a superconductor which detects a magnetic field created by the current as an electric signal.

19. A light detection method, comprising the steps of:
generating a current by inputting a light signal to a signal input portion;
injecting the current into a signal detecting portion including a superconductor; and
detecting a change in electrical characteristics of said superconductor to detect the light signal.

20. A light detecting method, comprising the steps of:
generating a current by inputting a light signal to a signal input portion;
causing a change in electrical characteristics of a superconductor by means of a magnetic field created by the current; and
detecting said change so as to detect the light signal.

* * * * *

UNITED STATES PATENT AND TRADEMARK OFFICE
CERTIFICATE OF CORRECTION

PATENT NO : 5,155,093

DATED : October 13, 1992

INVENTOR(S) : Tohru Den, et. al.

It is certified that error appears in the above-identified patent and that said Letters Patent is hereby corrected as shown below:

The Title page, showing the illustrative figure should be deleted and substitute therefor the attached Title page.

The sheet of drawings consisting of Figs. 1-31 should be deleted to be replaced with Figs. 1-31 as shown on per attached sheets.

Signed and Sealed this

Twenty-second Day of November, 1994

Attest:

BRUCE LEHMAN

Attesting Officer

Commissioner of Patents and Trademarks

United States Patent [19]
Den et al.

[11] Patent Number: 5,155,093
[45] Date of Patent: Oct. 13, 1992

[54] LIGHT DETECTING DEVICE AND LIGHT DETECTING METHOD USING A SUPERCONNECTOR

[75] Inventors: Tohru Den, Funabashi; Katsuhiko Shinjo, Atsugi; Taiko Motoi, Atsugi; Takehiko Kawasaki, Atsugi; Norio Kaneko, Atsugi, all of Japan

[73] Assignee: Canon Kabushiki Kaisha, Tokyo, Japan

[21] Appl. No.: 548,212

[22] Filed: Jul. 5, 1990

[30] Foreign Application Priority Data

| Jul. 5, 1989 | [JP] | Japan | 1-171917 |
| Jul. 5, 1989 | [JP] | Japan | 1-171918 |
| Jul. 14, 1989 | [JP] | Japan | 1-180285 |
| Jul. 14, 1989 | [JP] | Japan | 1-180286 |
| Jul. 19, 1989 | [JP] | Japan | 1-184424 |
| Jul. 19, 1989 | [JP] | Japan | 1-184425 |
| Jul. 27, 1989 | [JP] | Japan | 1-192528 |
| Jul. 27, 1989 | [JP] | Japan | 1-192529 |
| Jul. 27, 1989 | [JP] | Japan | 1-192530 |

[51] Int. Cl.⁵ .................. H01J 40/14; H01B 12/00
[52] U.S. Cl. ............................ 505/1; 505/702; 250/211 J; 357/5
[58] Field of Search ............ 505/1, 701, 702, 726, 505/848, 849, 864, 865, 874; 357/5, 30, 83; 250/336.2, 211 J; 307/311, 306

[56] References Cited

U.S. PATENT DOCUMENTS

| 4,334,158 | 6/1982 | Faris | 357/5 |
| 4,521,682 | 6/1985 | Murakami et al. | 250/208.1 |
| 4,814,598 | 3/1989 | Faris | 357/5 |
| 4,843,446 | 6/1989 | Nishino et al. | 357/5 |
| 4,942,142 | 7/1990 | Itozaki et al. | 505/702 |
| 4,963,852 | 10/1990 | Drehman | 505/1 |
| 4,970,395 | 11/1990 | Kruse, Jr. | 505/701 |
| 4,990,487 | 2/1991 | Masumi | 250/211 J |
| 5,011,818 | 4/1991 | Katoka et al. | 505/1 |

FOREIGN PATENT DOCUMENTS

| 0248870 | 8/1987 | Fed. Rep. of Germany | 505/848 |
| 64-50486 | 2/1989 | Japan |  |
| 0088318 | 4/1989 | Japan | 505/848 |

OTHER PUBLICATIONS

Clarke, "Small-scale analog applications of high-transmition-temperature superconductors", Nature vol. 333, May 5, 1988, pp. 29-35.
Cirovic et al., Electronic Devices, Circuits, and Systems 3rd Ed., 1987, pp. 128-131.
Nakane et al., "DC-SQUID with High-Critical-Temperature Oxide-Superconductor Film", Japanese J. of Appl. Phisc., 1987, pp. L1925-L1926.
Higashino et al., "Observation of the Josephson Effect in Y-Ba-Cu-O Compound", Japanese J. of Appl. Physics, 1987, pp. L1211-L1213.

Primary Examiner—David C. Nelms
Assistant Examiner—Michael Messinger
Attorney, Agent, or Firm—Fitzpatrick, Cella, Harper & Scinto

[57] ABSTRACT

A light detecting device includes a signal input portion which generates a current upon input of a light signal, a signal detecting portion including a superconductor which detects the light signal with injection of the generated current, and electrodes through which the generated current is injected into the superconductor.

20 Claims, 23 Drawing Sheets

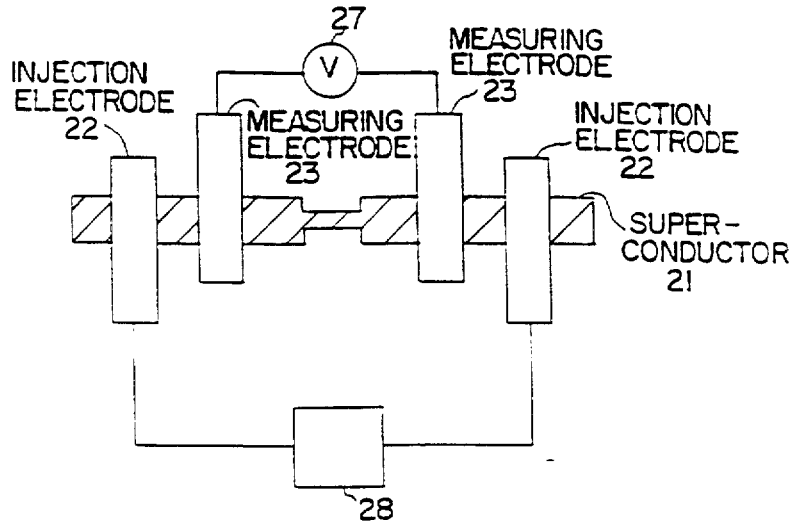

UNITED STATES PATENT AND TRADEMARK OFFICE
CERTIFICATE OF CORRECTION

PATENT NO. : 5,155,093

DATED : October 13, 1992

INVENTOR(S) : TOHRU DEN, ET AL.

Page 3 of 25

It is certified that error appears in the above-identified patent and that said Letters Patent is hereby corrected as shown below: On the title page:

Item: [54] TITLE

"SUPERCONNECTOR" should read --SUPERCONDUCTOR--.

AT [56] REFERENCES CITED

Foreign Patent Documents, insert
-- 81007  6/83  Europe
  2140998  5/84  Great Britain--.

Other Publications, insert
--Y. Enomoto et al., "Highly Sensitive Optical Detector Using Superconducting Oxide $BaPb_{0.7}Bi_{0.3}O_3(BPB)$", Japanese Journal of Applied Physics, vol. 23, no. 1, 1984, pp. L333-335.--; and
--Y. Enomoto et al., "Far Infrared Detector Using Boundary Josephson Junctions", Japanese Journal of Applied Physics, vol. 26, supplement 26-3, 1987, pp. 1145-1146.--.

Other Publications,
In Clarke, etc., "mition-temperature" should read --ition-temperature--; and
In Nakane et al., etc., "Phisc.," should read --Physics,--.

SHEETS 1 THROUGH 23

FIGS. 1 - 31, Insert attached amended Figures 1 to 31.

UNITED STATES PATENT AND TRADEMARK OFFICE
CERTIFICATE OF CORRECTION

PATENT NO. : 5,155,093

DATED : October 13, 1992

INVENTOR(S) : TOHRU DEN, ET AL.

It is certified that error appears in the above-identified patent and that said Letters Patent is hereby corrected as shown below:

COLUMN 1

Line 3, "SUPERCONNECTOR" should read --SUPERCONDUCTOR--.

COLUMN 8

Line 18, "pointed" should read --pointed to--.

COLUMN 9

Line 65, "facture" should read --facturing--.

COLUMN 12

Line 15, "manufacture" should read --manufacturing--.
Line 41, "(77k.)," should read --(77k),--.

UNITED STATES PATENT AND TRADEMARK OFFICE
CERTIFICATE OF CORRECTION

PATENT NO. : 5,155,093

DATED : October 13, 1992

INVENTOR(S) : TOHRU DEN, ET AL.

It is certified that error appears in the above-identified patent and that said Letters Patent is hereby corrected as shown below:

<u>COLUMN 16</u>

Line 10, "manufacture" should read --manufacturing--.